US009660051B1

(12) United States Patent
Masuoka et al.

(10) Patent No.: US 9,660,051 B1
(45) Date of Patent: May 23, 2017

(54) METHOD FOR PRODUCING SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/402,361

(22) Filed: Jan. 10, 2017

Related U.S. Application Data

(60) Division of application No. 14/824,633, filed on Aug. 12, 2015, now Pat. No. 9,590,098, which is a
(Continued)

(51) Int. Cl.
*H01L 29/66* (2006.01)
*H01L 29/78* (2006.01)
(Continued)

(52) U.S. Cl.
CPC .... *H01L 29/66545* (2013.01); *H01L 29/7827* (2013.01)

(58) Field of Classification Search
CPC ......... H01L 29/66545; H01L 29/42372; H01L 29/7827; H01L 29/0657
See application file for complete search history.

(56) References Cited

U.S. PATENT DOCUMENTS 6,891,234 B1    5/2005 Connelly et al.
2007/0087489 A1* 4/2007 Park ...................... B82Y 10/00
                                                          438/149
(Continued)

FOREIGN PATENT DOCUMENTS

JP    H02-071556 A    3/1990
JP    H02-188966 A    7/1990
(Continued)

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", *IEEE*, pp. 247-250, 2007.
(Continued)

*Primary Examiner* — Christine Enad
(74) *Attorney, Agent, or Firm* — Brinks Gilson & Lione

(57) ABSTRACT

A method for producing a semiconductor device includes forming a first insulating film around a fin-shaped semiconductor layer and forming a pillar-shaped semiconductor layer and forming a second diffusion layer in an upper portion of the fin-shaped semiconductor layer and a lower portion of the pillar-shaped semiconductor layer. A metal-semiconductor compound is formed on the second diffusion layer. A first metal is deposited to form a gate electrode and a gate line. Second and third metal films are deposited to form a first contact in which the second metal film surrounds a sidewall of an upper portion of the pillar-shaped semiconductor layer, and a second contact connects an upper portion of the first contact and an upper portion of the pillar-shaped semiconductor layer. A third contact is formed on the gate line.

10 Claims, 41 Drawing Sheets

Related U.S. Application Data continuation of application No. PCT/JP2013/069666, filed on Jul. 19, 2013.

(51) Int. Cl.
*H01L 29/423* (2006.01)
*H01L 29/06* (2006.01)

(56) References Cited

U.S. PATENT DOCUMENTS

| | | | |
|---|---|---|---|
| 2010/0210079 | A1 | 8/2010 | Masuoka et al. |
| 2010/0213539 | A1* | 8/2010 | Masuoka ............. H01L 21/84 257/329 |
| 2011/0084269 | A1* | 4/2011 | Yamazaki .......... H01L 29/7869 257/43 |
| 2012/0142154 | A1 | 6/2012 | Masuoka et al. |
| 2012/0193620 | A1* | 8/2012 | Godo ................. H01L 29/7869 257/43 |

FOREIGN PATENT DOCUMENTS

| | | |
|---|---|---|
| JP | H03-145761 A | 6/1991 |
| JP | 11-297984 A | 10/1999 |
| JP | 2004-356314 A | 12/2004 |
| JP | 2009-182317 A | 8/2009 |
| JP | 2012-531751 A | 12/2012 |
| WO | WO 2009/110050 A1 | 9/2009 |
| WO | WO 2013/069102 A1 | 5/2013 |
| WO | WO 2013/080378 A1 | 6/2013 |
| WO | WO 2013/093988 A1 | 6/2013 |

OTHER PUBLICATIONS

Wu et al., "High Performance 22/20nm FinFET CMOS Devices with Advanced High-K/Metal Gate Scheme", IEEE, pp. 27.1.1-27.1.4, 2010.
International Search Report and Written Opinion with English Translation for PCT/JP2013/069666 dated Oct. 15, 2013, 6 pages.
International Preliminary Report on Patentability in corresponding International Application No. PCT/JP2013/069666 dated Jan. 28, 2016, 6 pages.
Office Action in corresponding U.S. Appl. No. 14/824,633, dated Jun. 7, 2016, 9 pages.
Notice of Allowance in corresponding U.S. Appl. No. 14/824,633, dated Nov. 21, 2016, 8 pages.

* cited by examiner

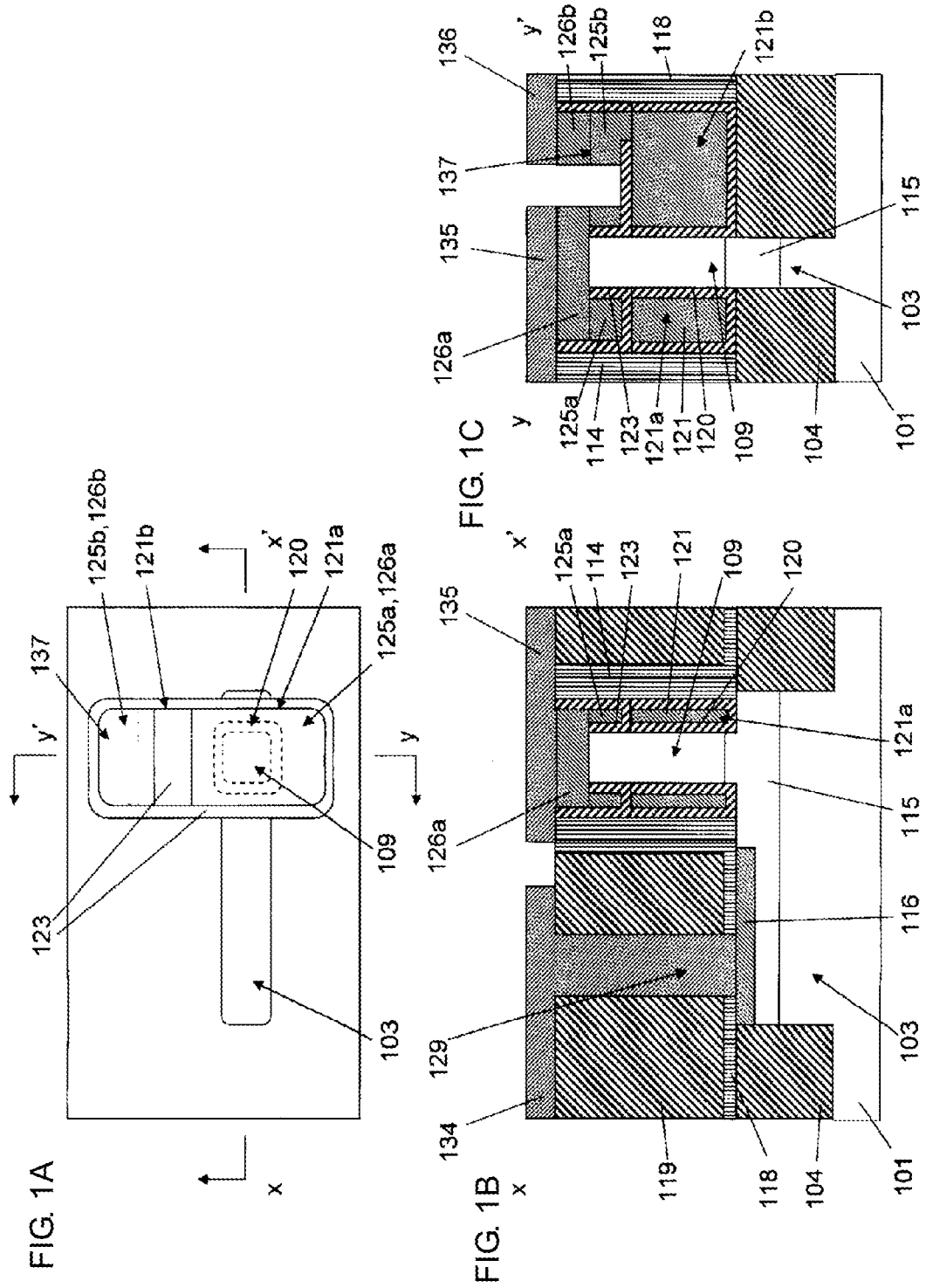

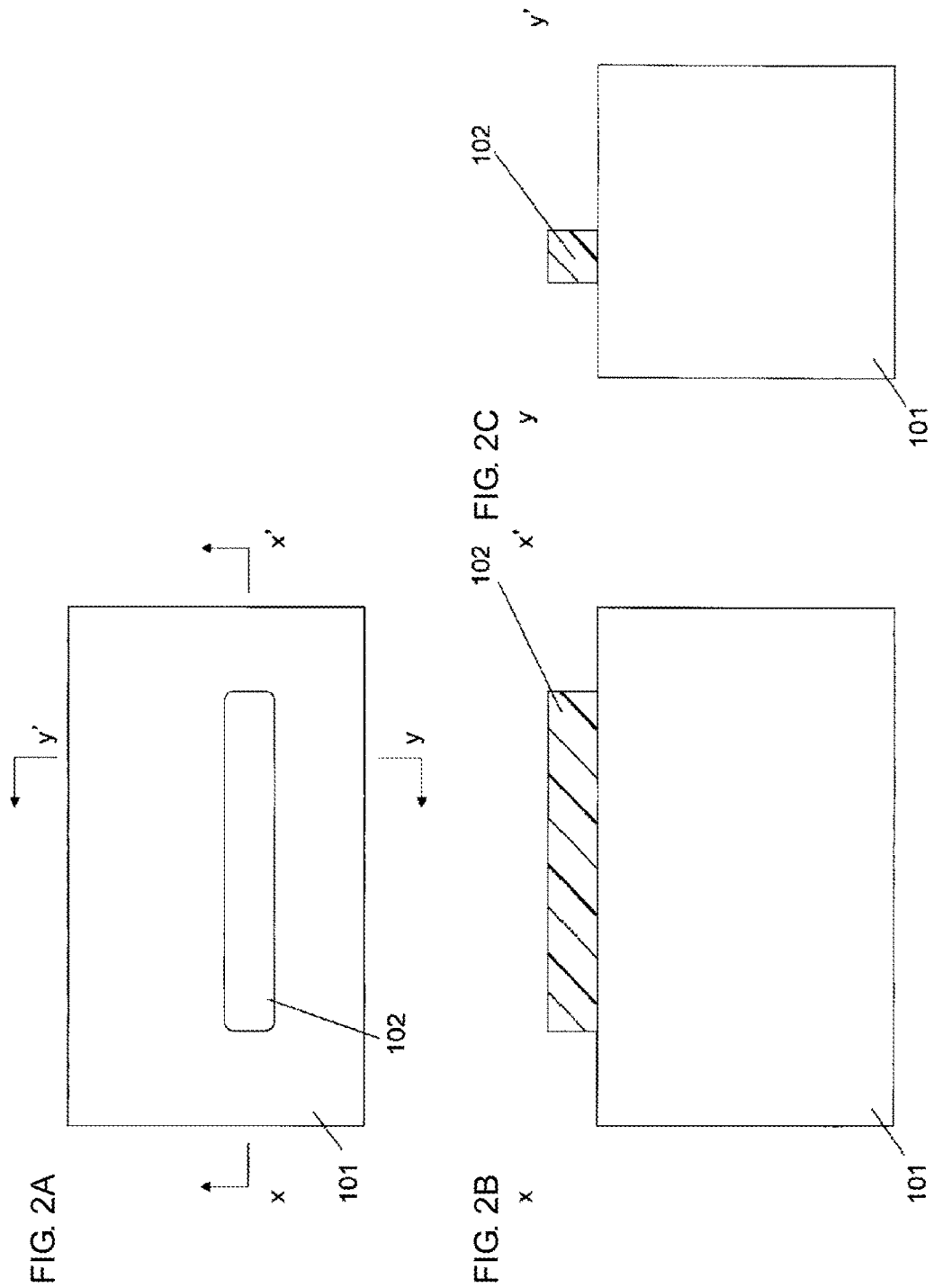

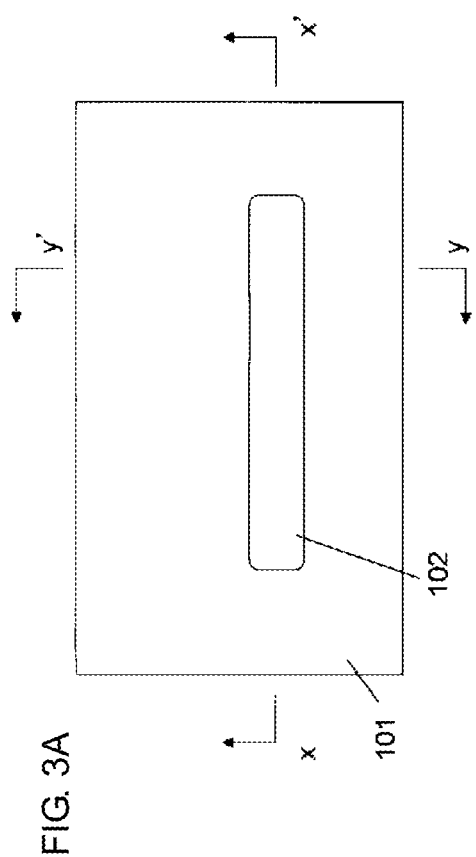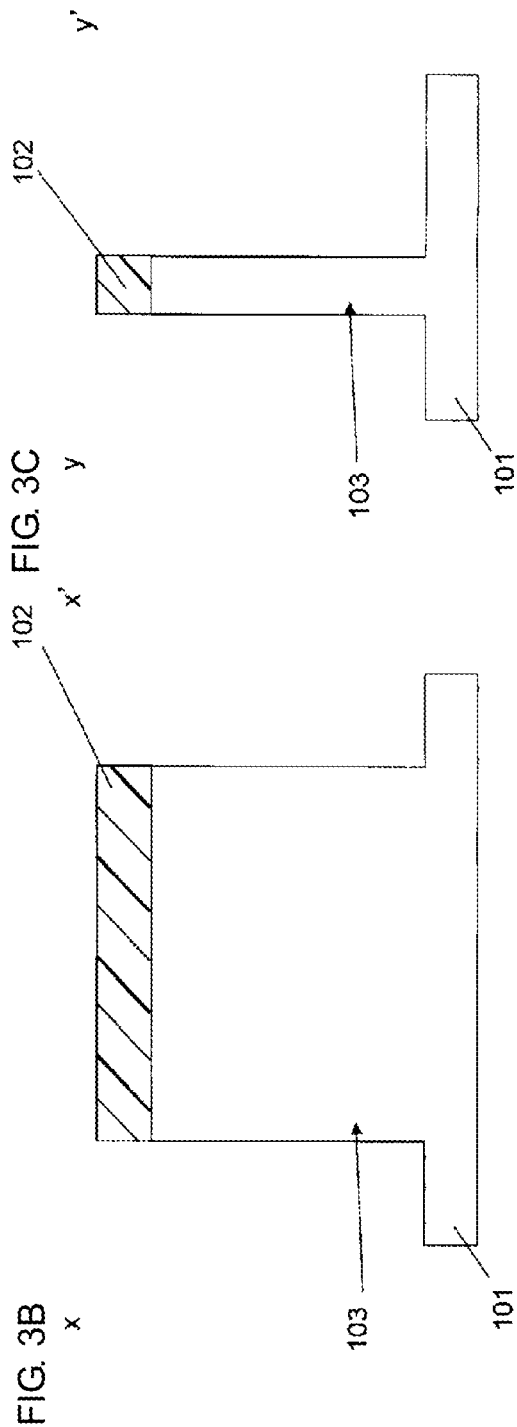

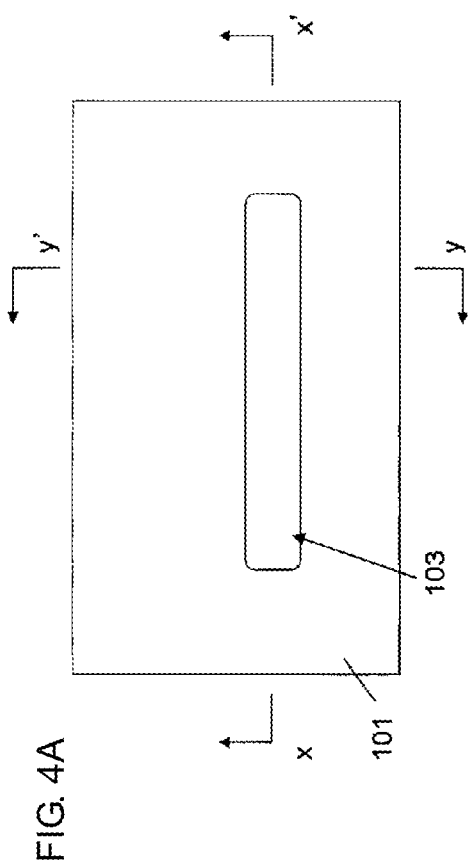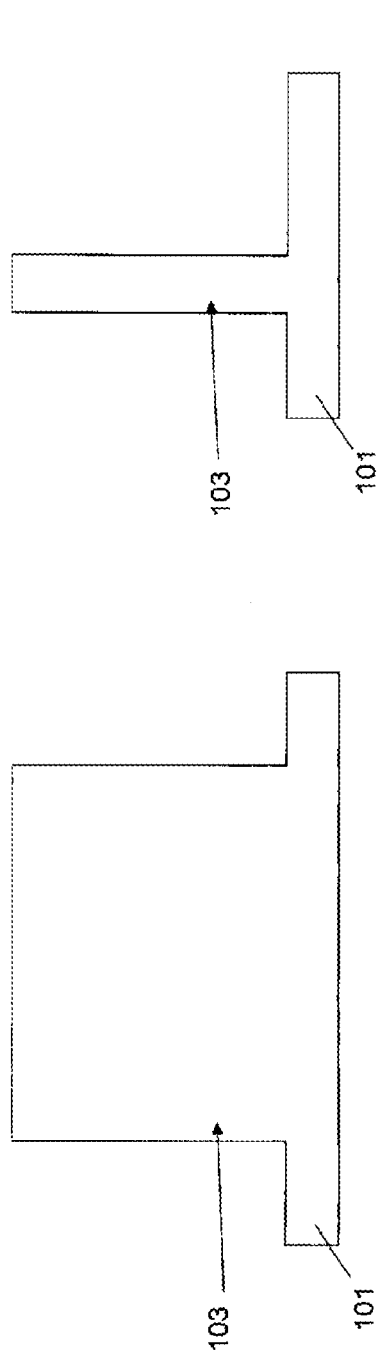

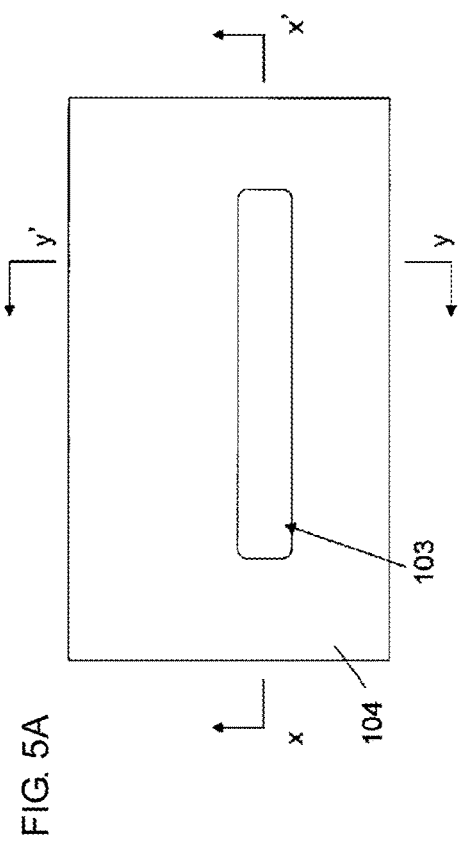
FIG. 5A
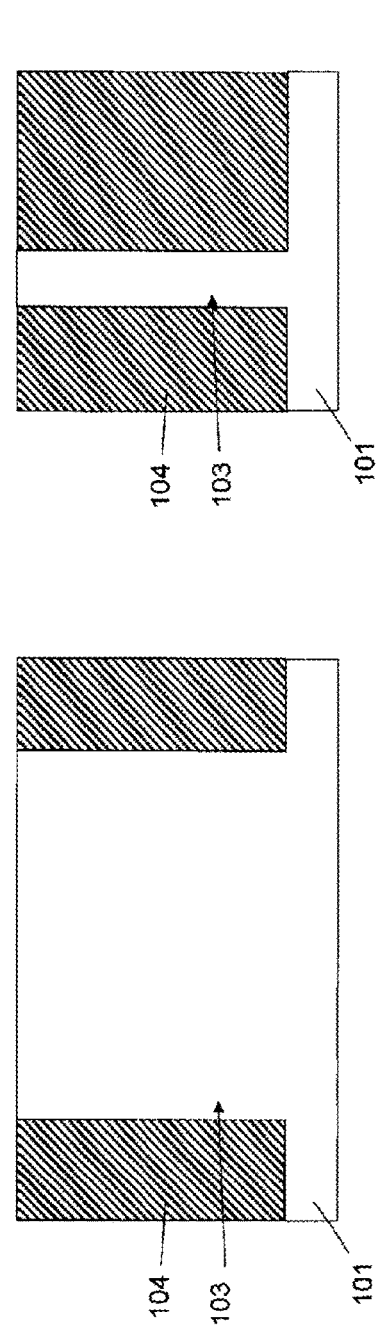
FIG. 5B
FIG. 5C

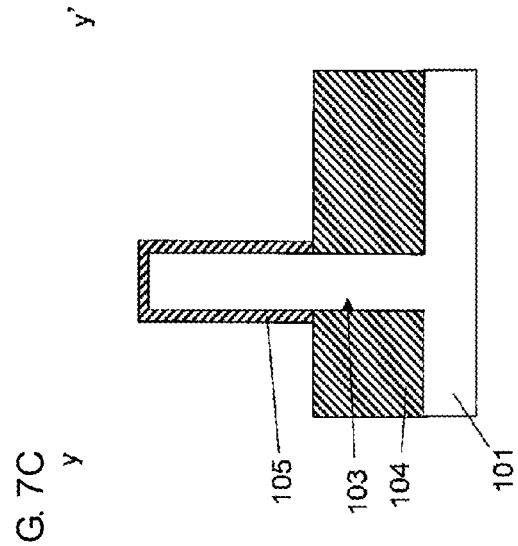
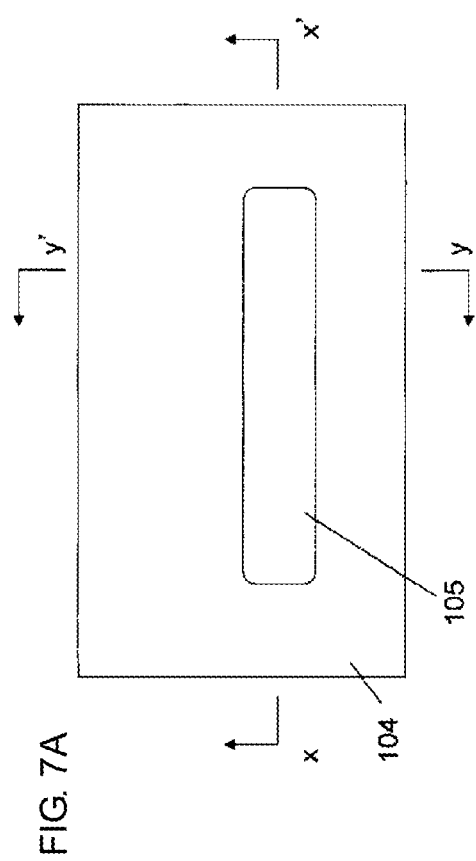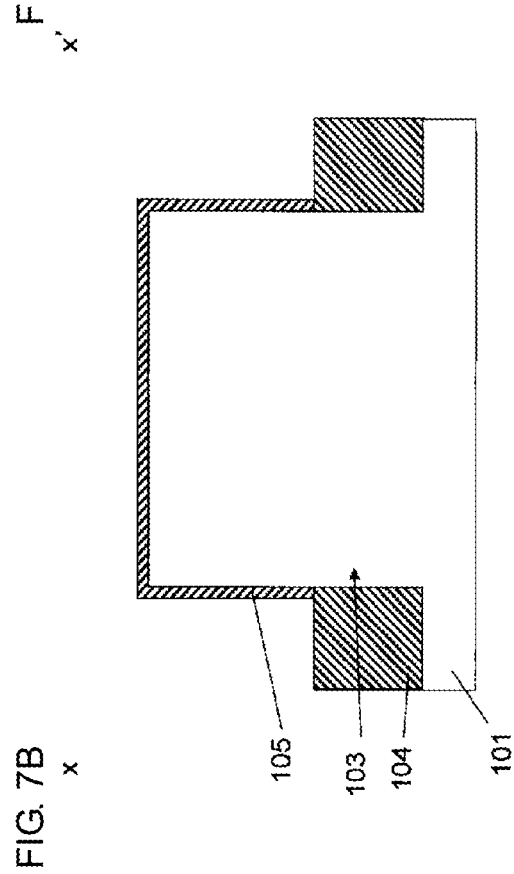
FIG. 7A
FIG. 7B
FIG. 7C

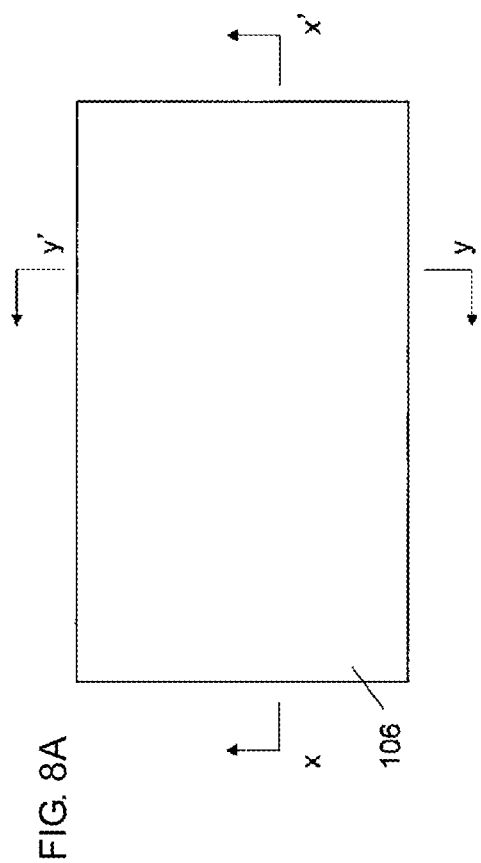
FIG. 8A
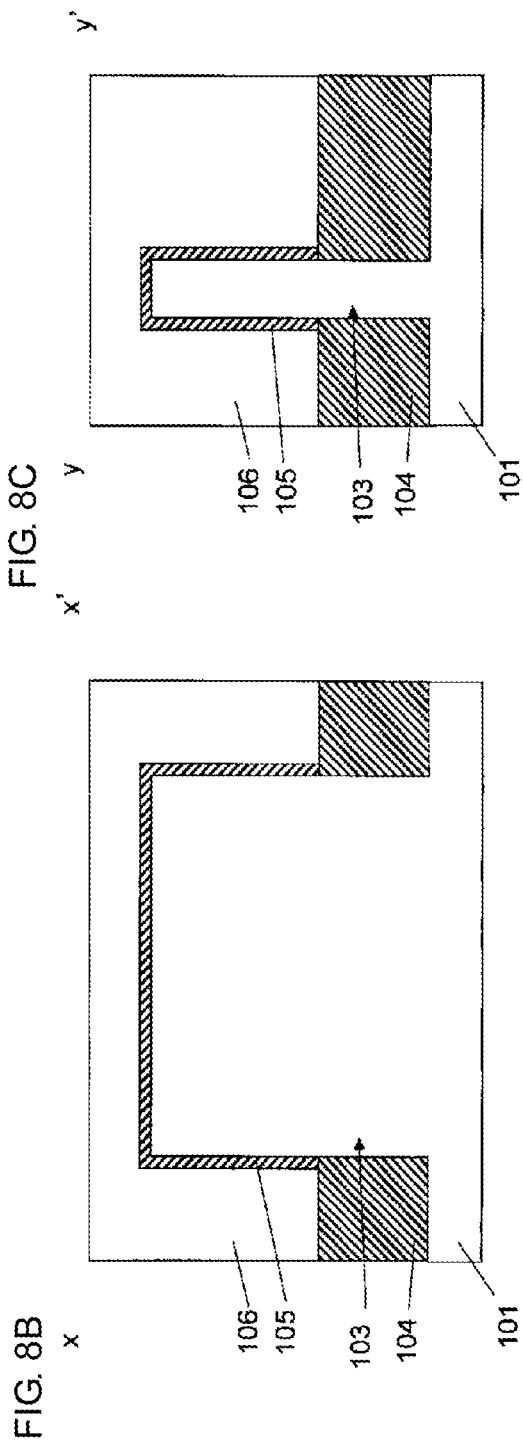
FIG. 8B
FIG. 8C

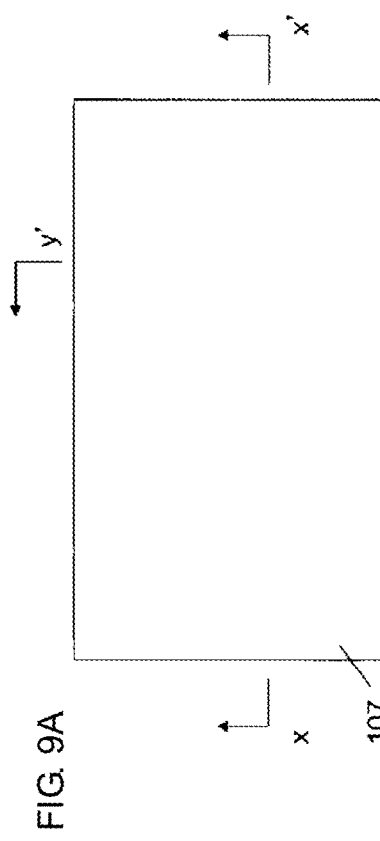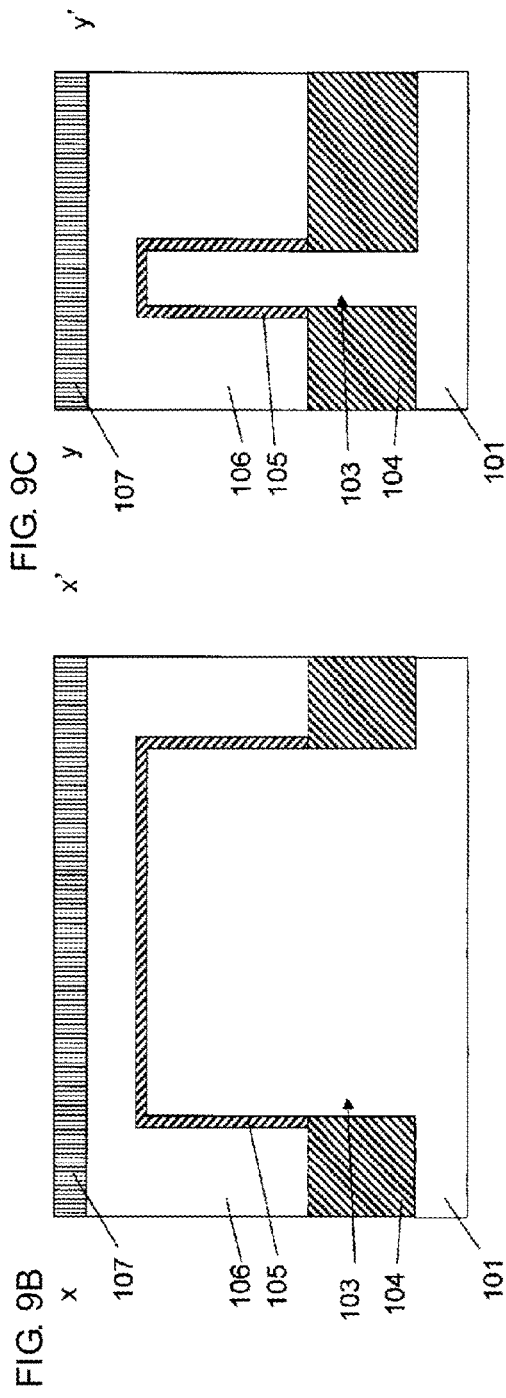

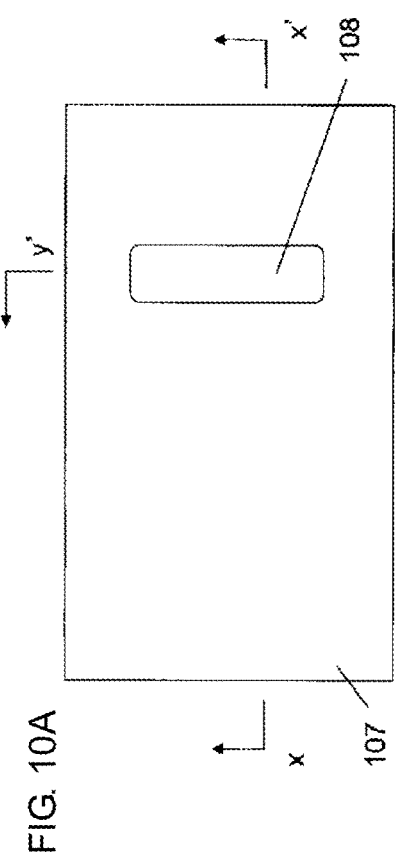
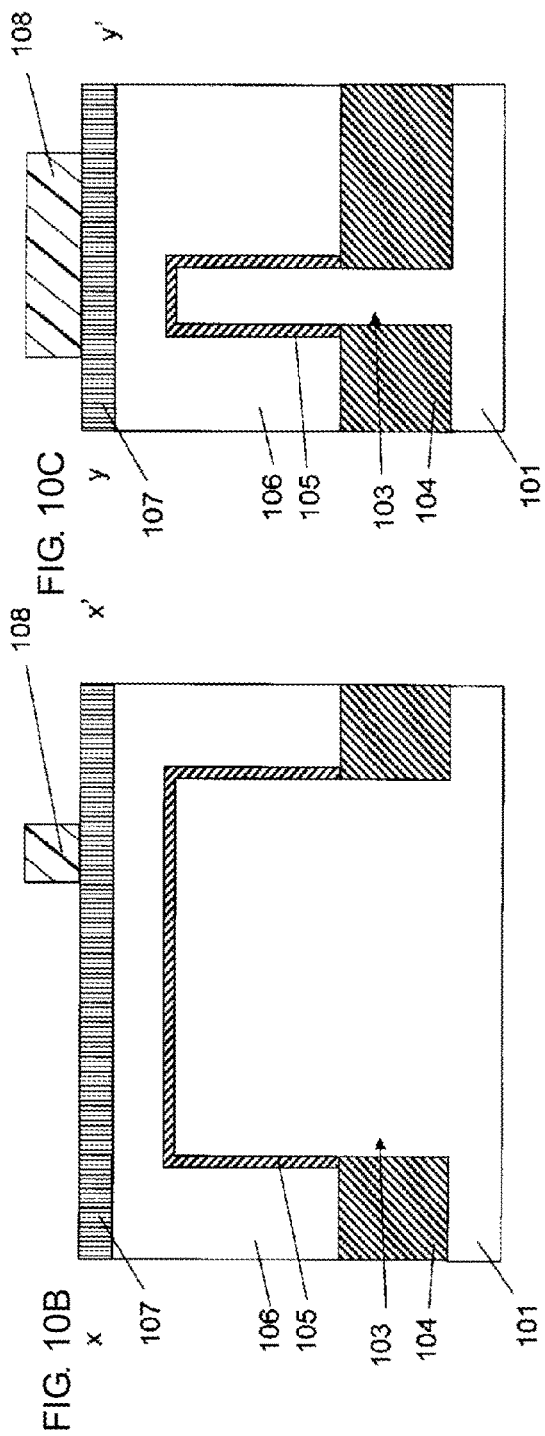
FIG. 10A
FIG. 10B
FIG. 10C

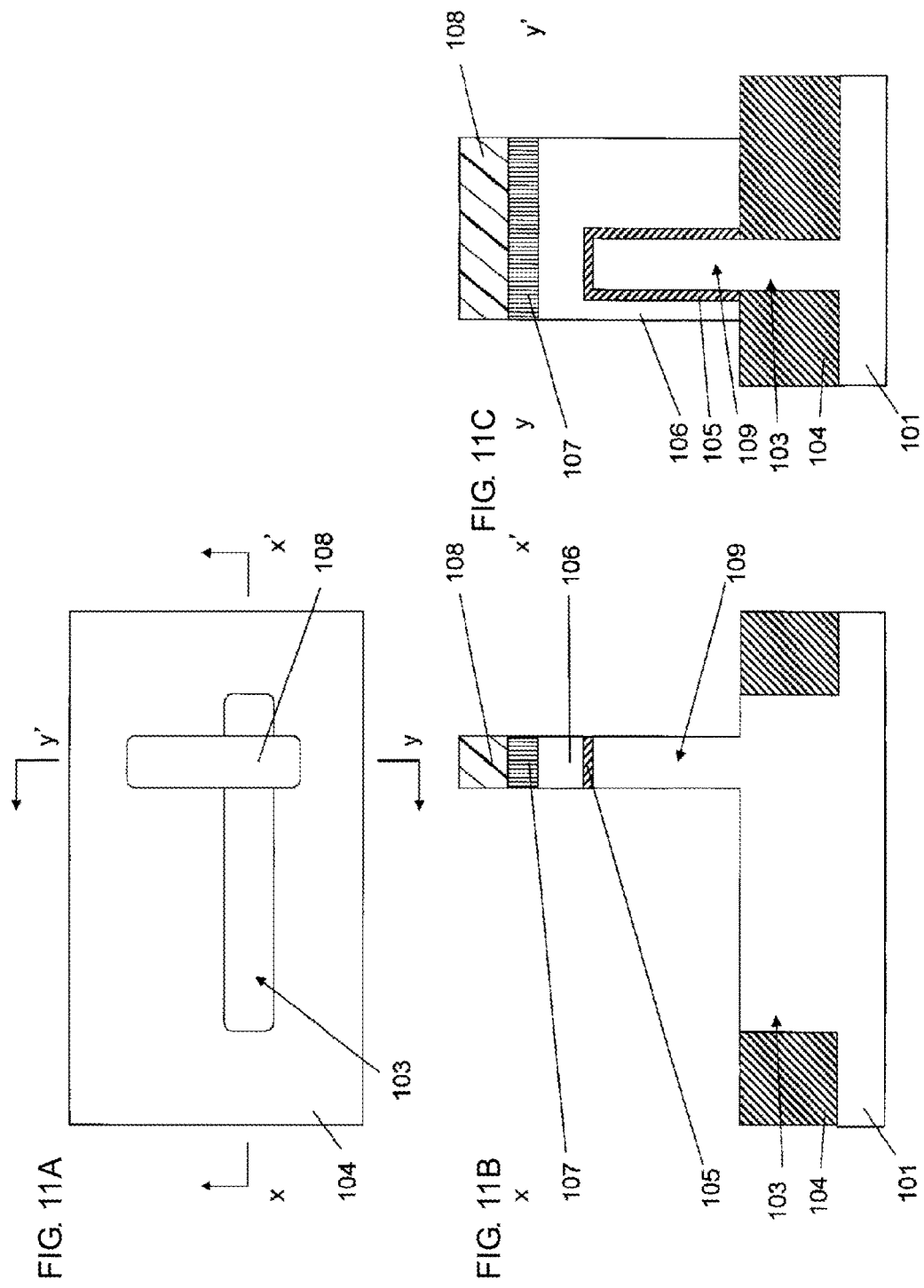

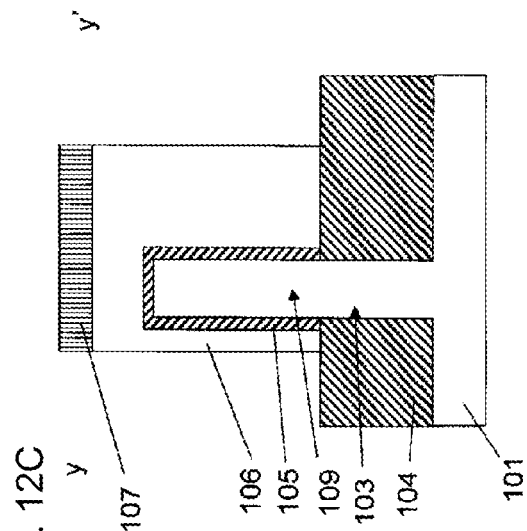
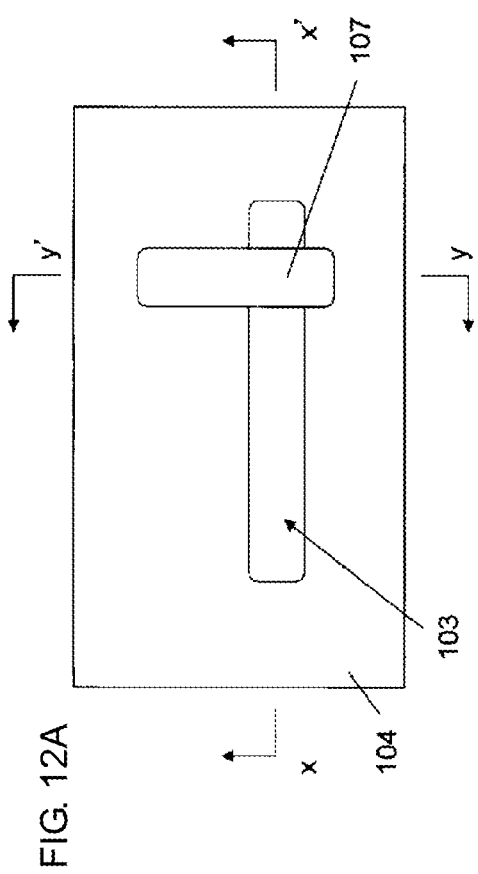
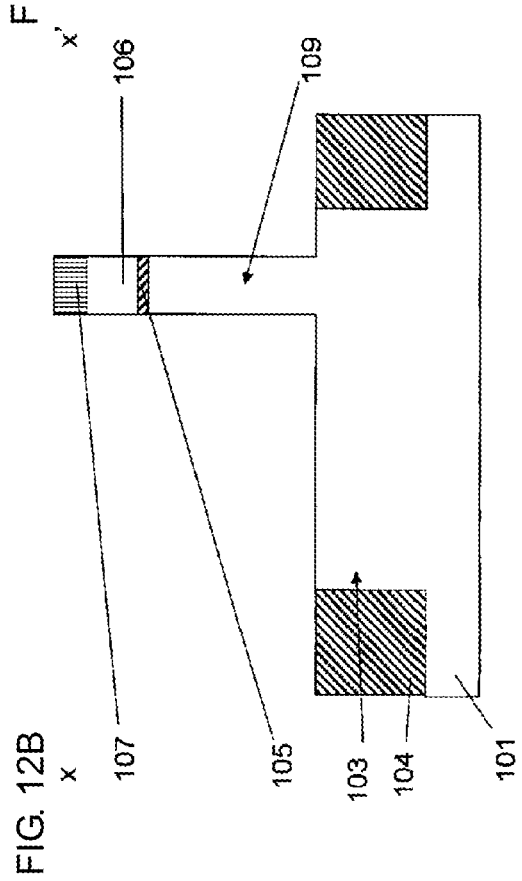

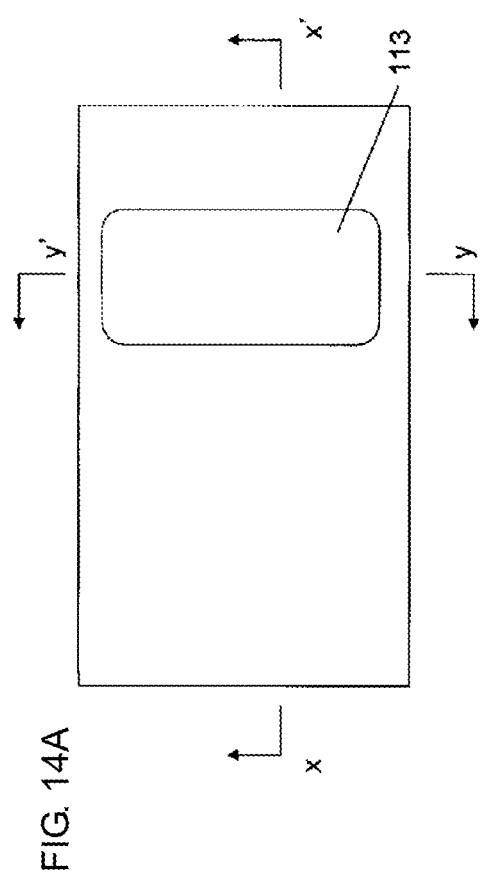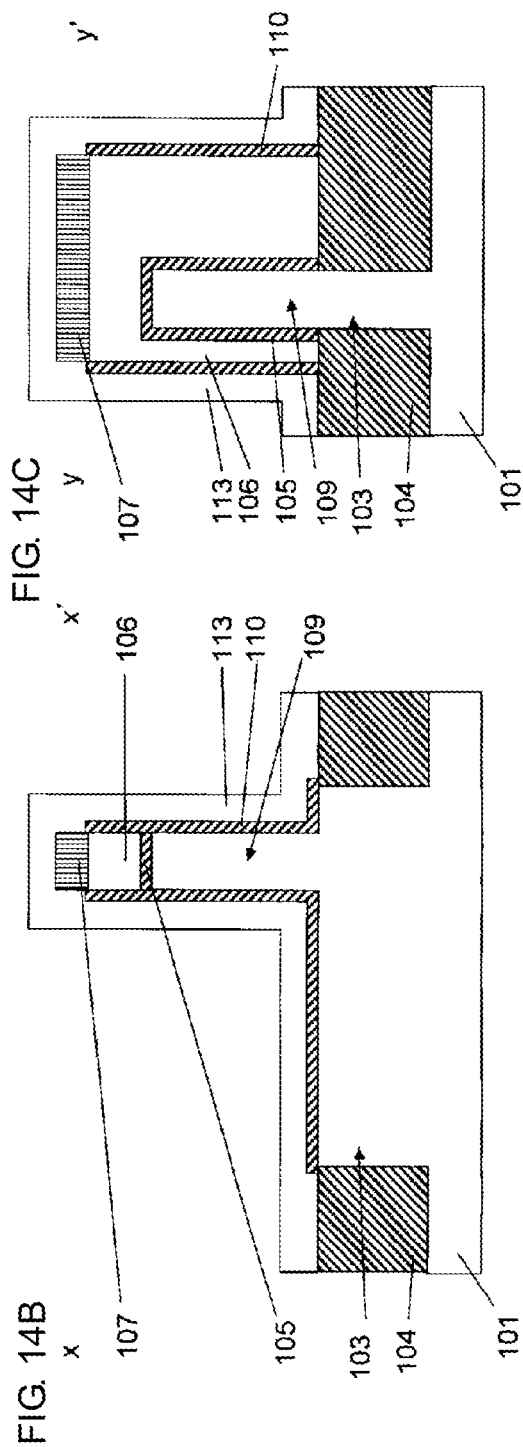

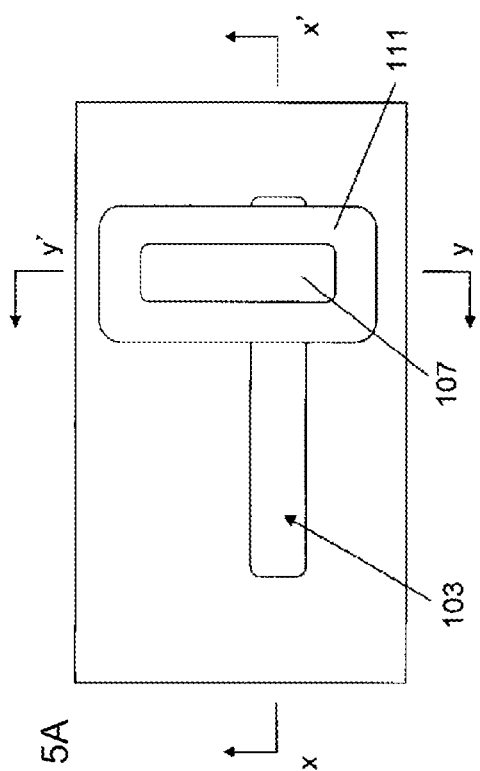
FIG. 15A
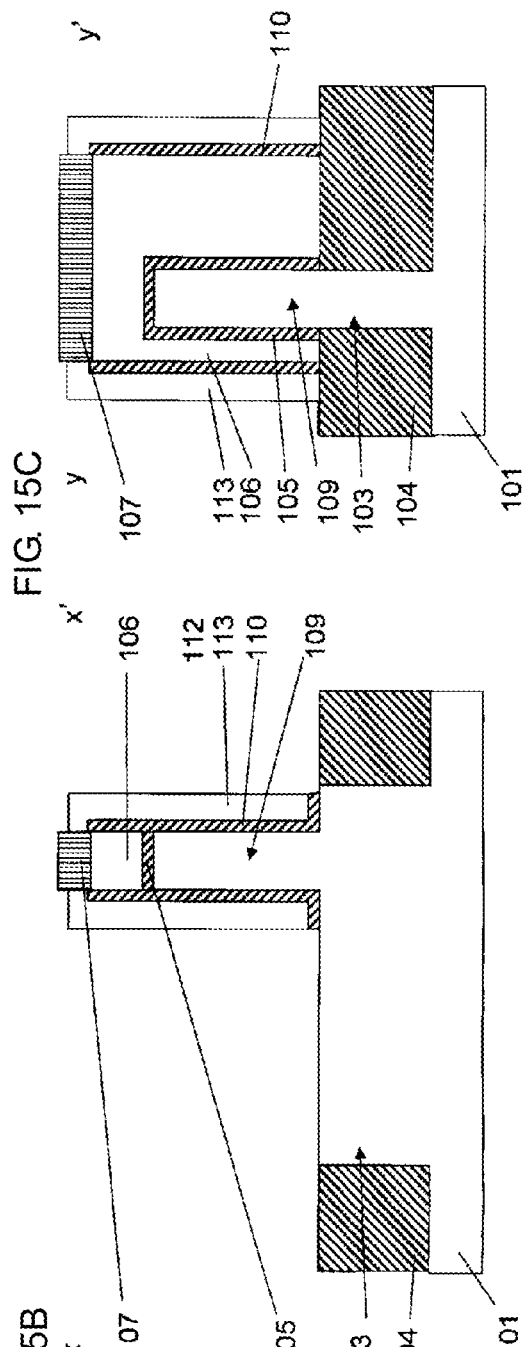
FIG. 15B
FIG. 15C

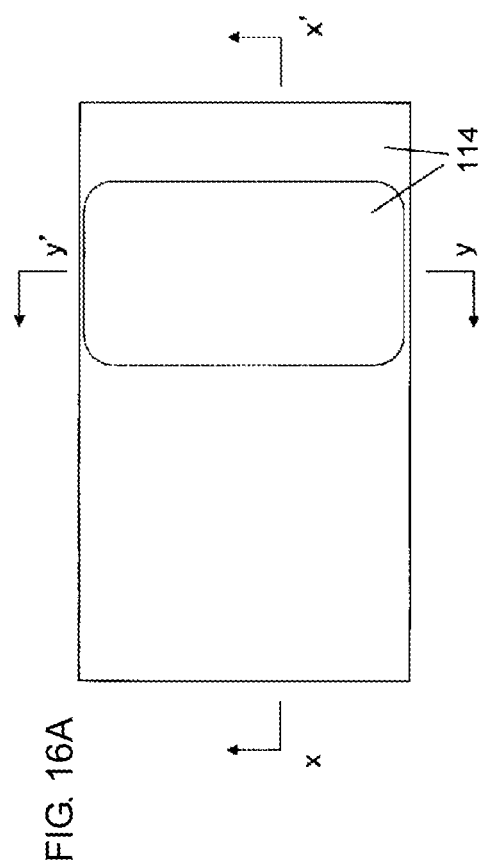
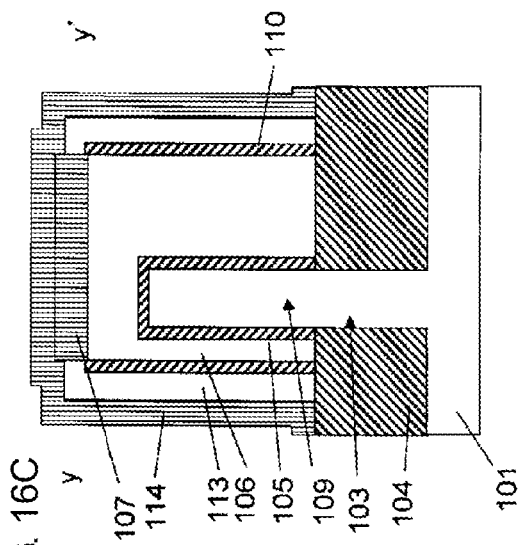
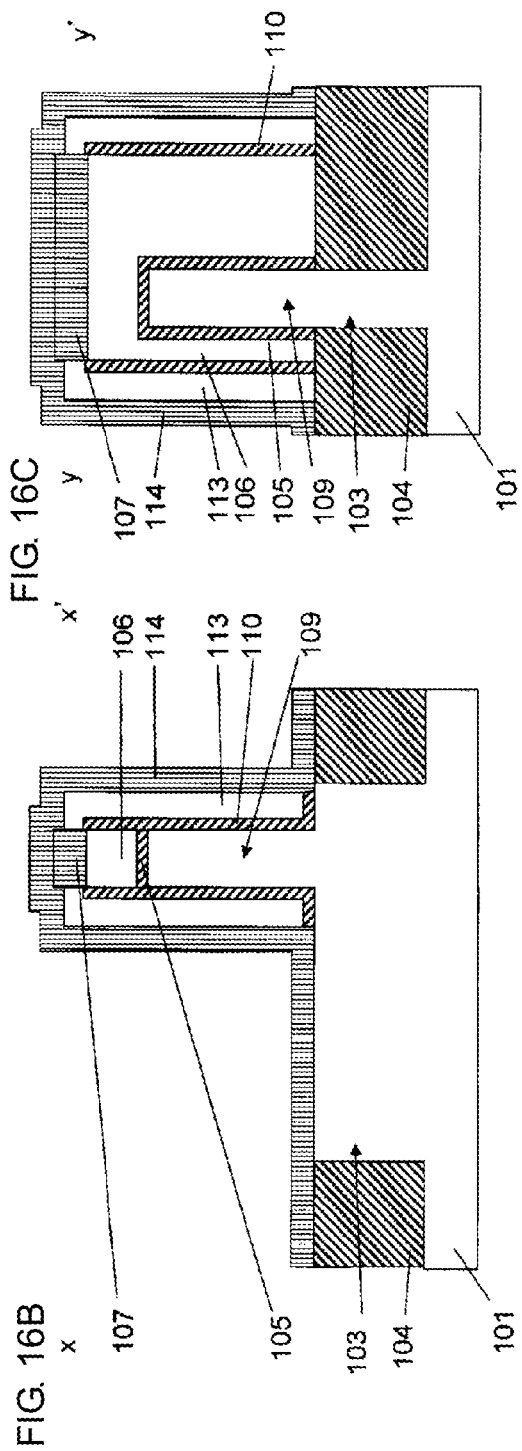
FIG. 16A
FIG. 16B
FIG. 16C

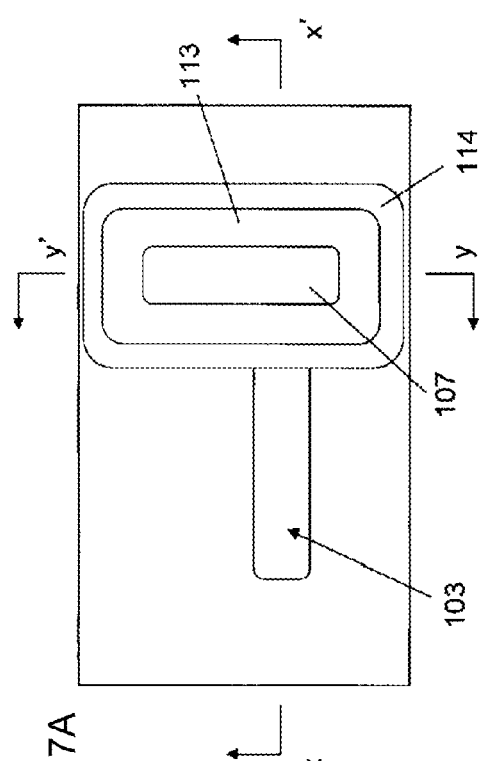
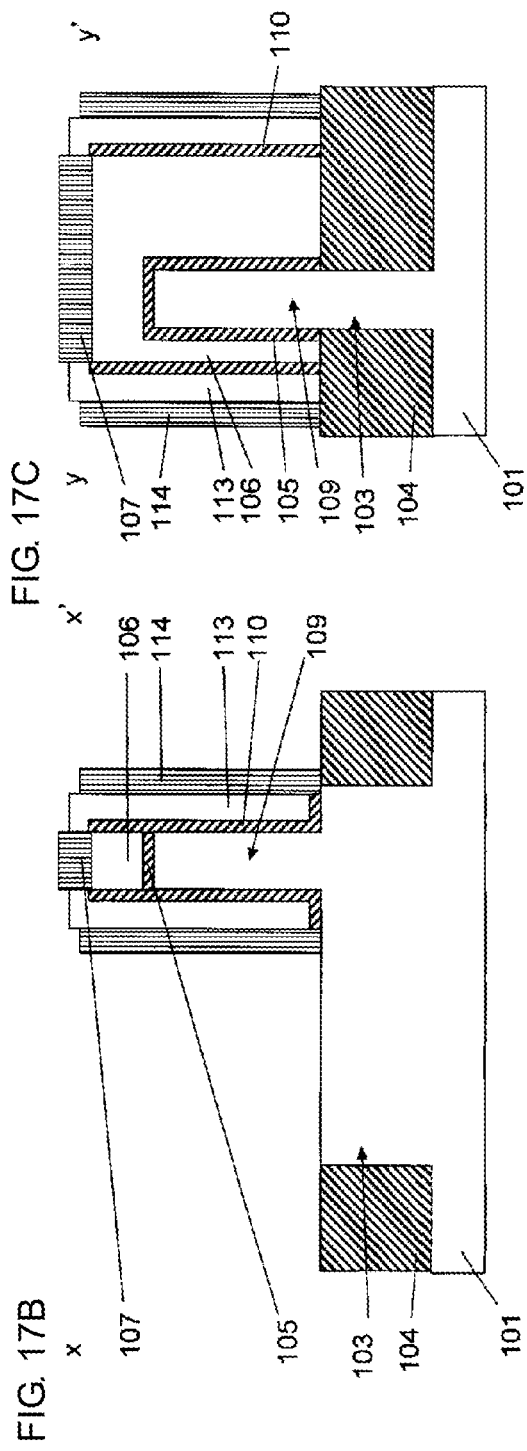
FIG. 17A
FIG. 17B
FIG. 17C

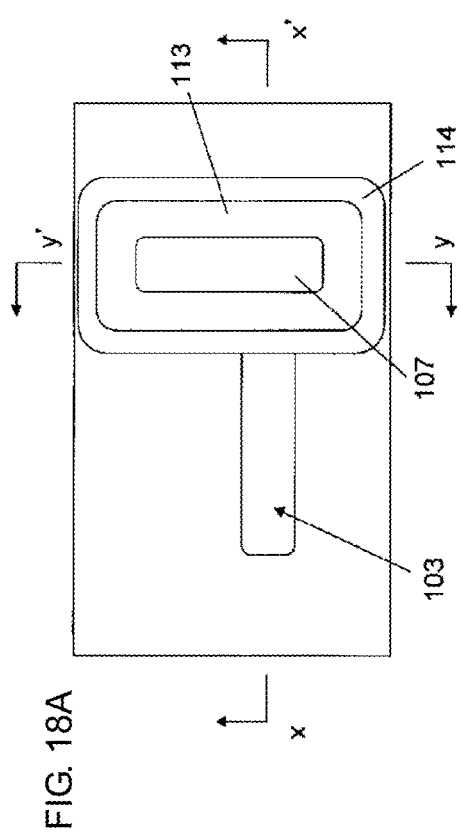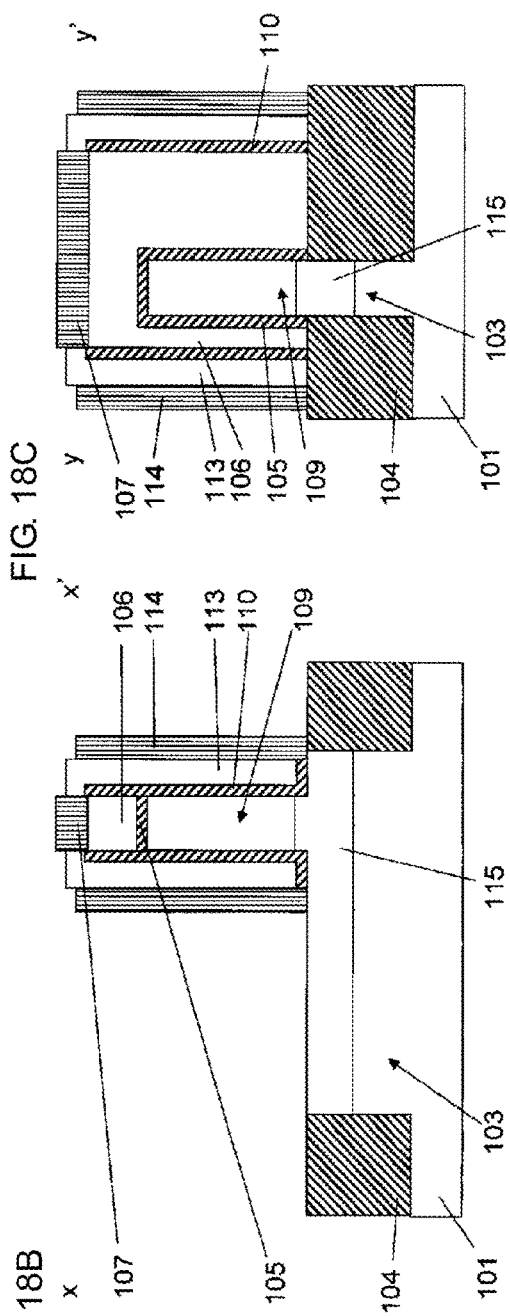

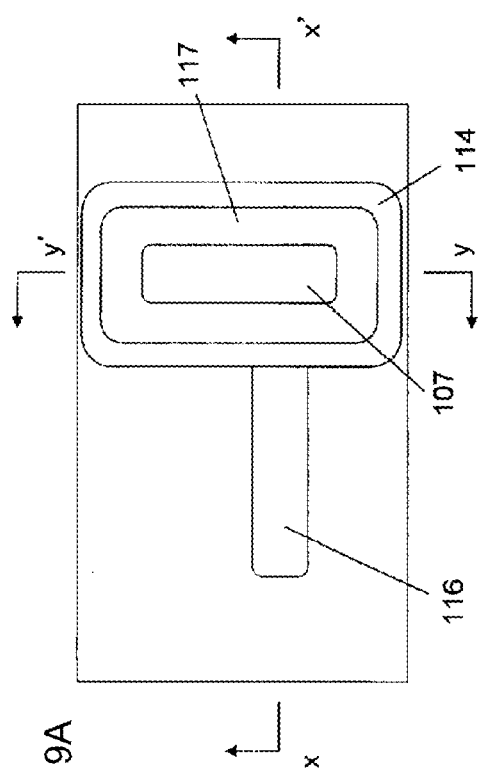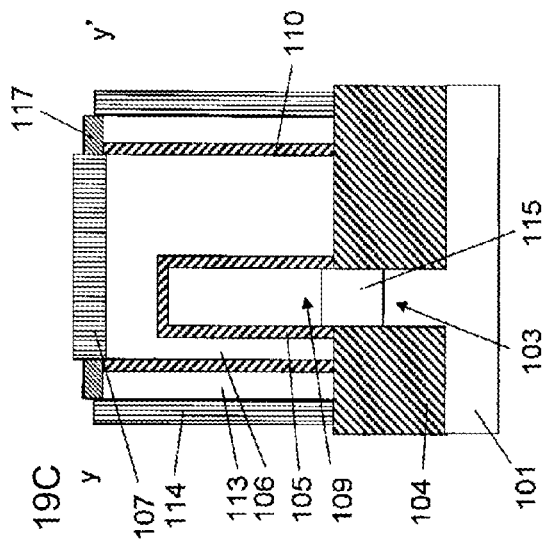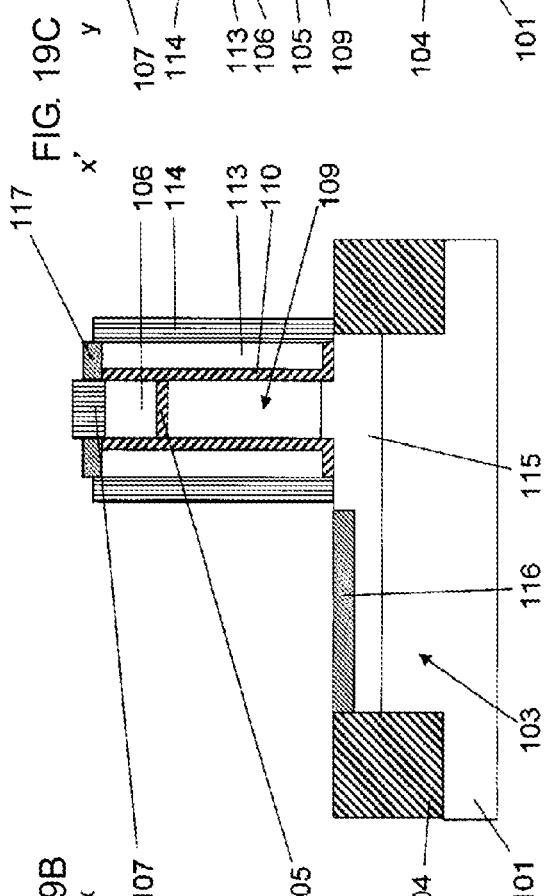

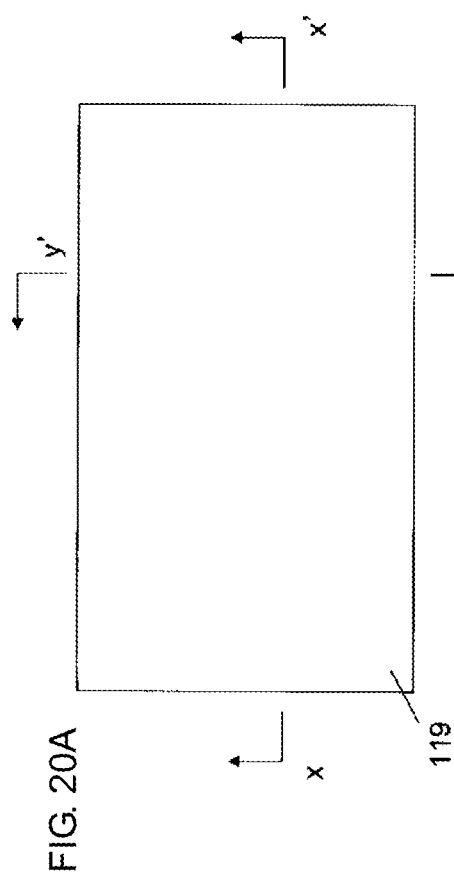
FIG. 20A
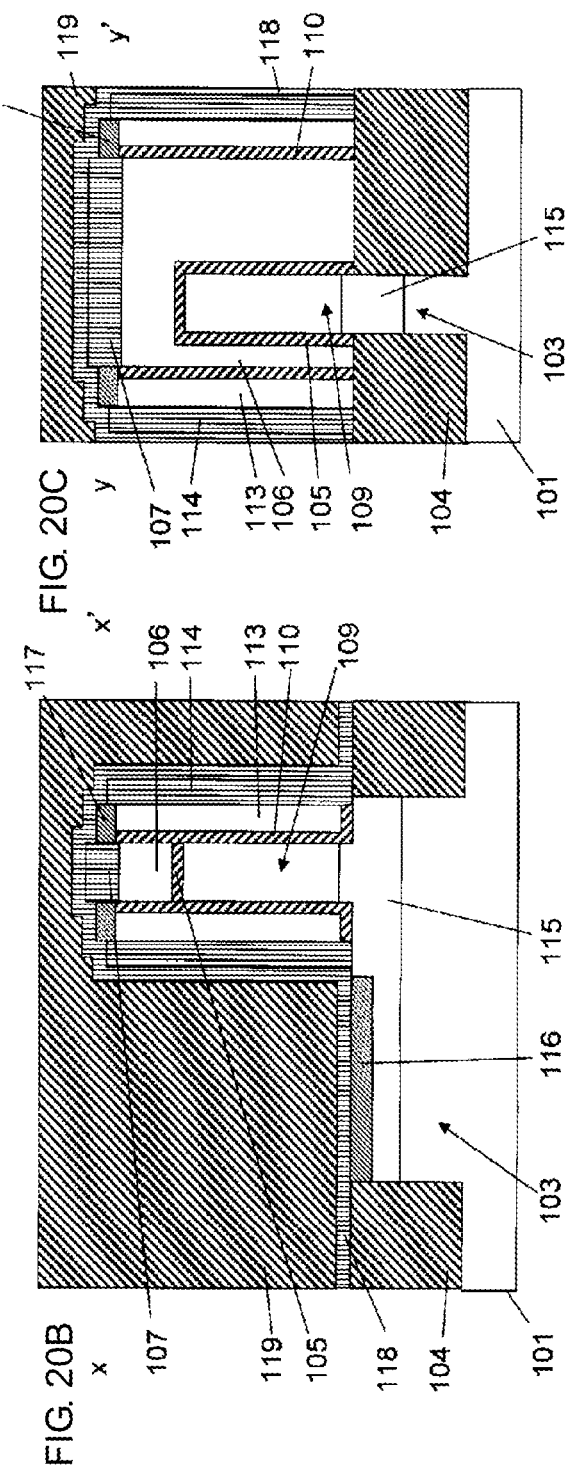
FIG. 20B
FIG. 20C

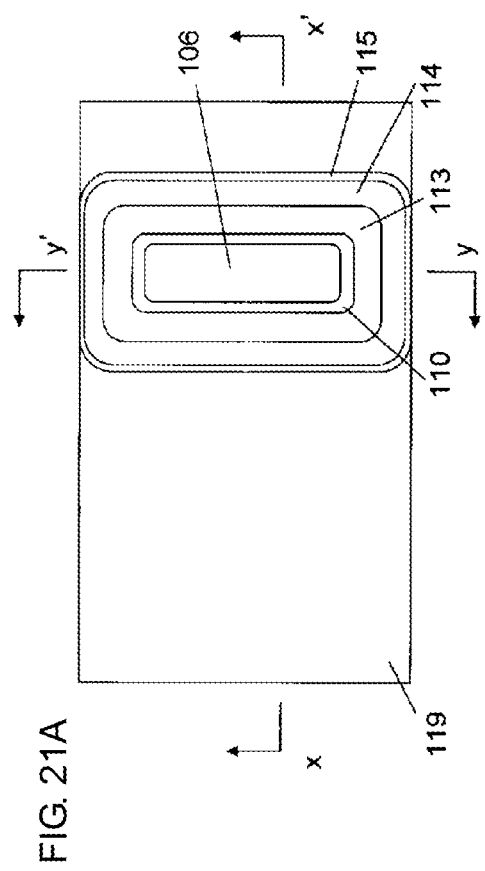
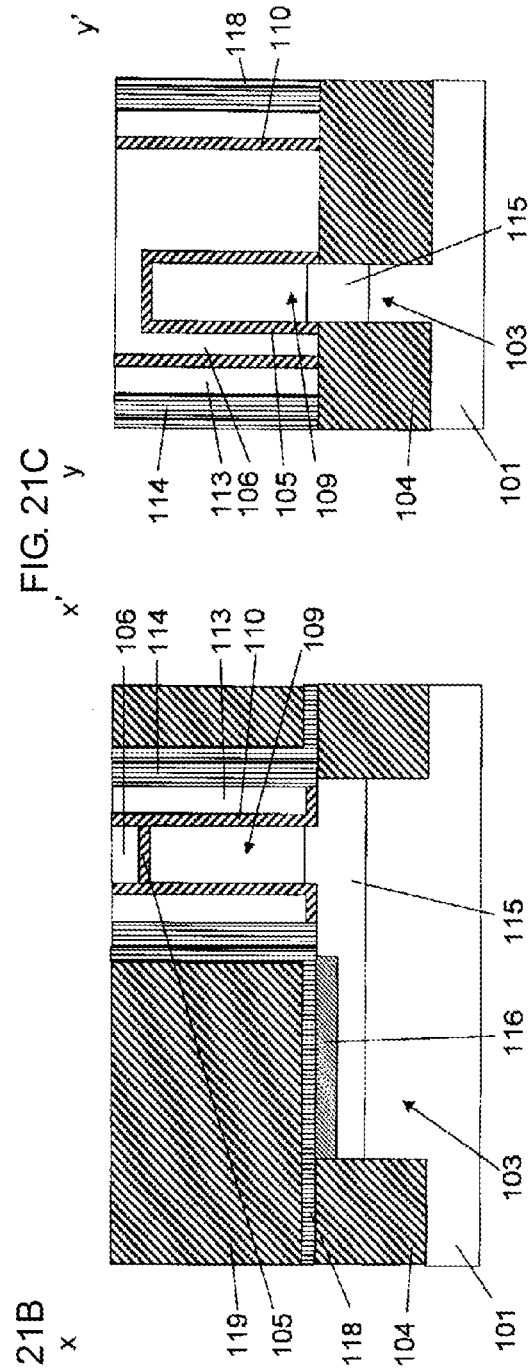
FIG. 21A
FIG. 21B
FIG. 21C

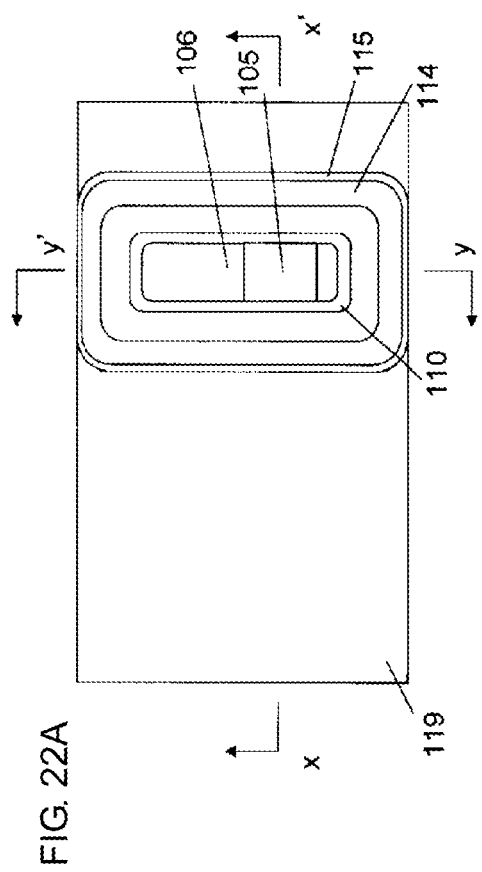
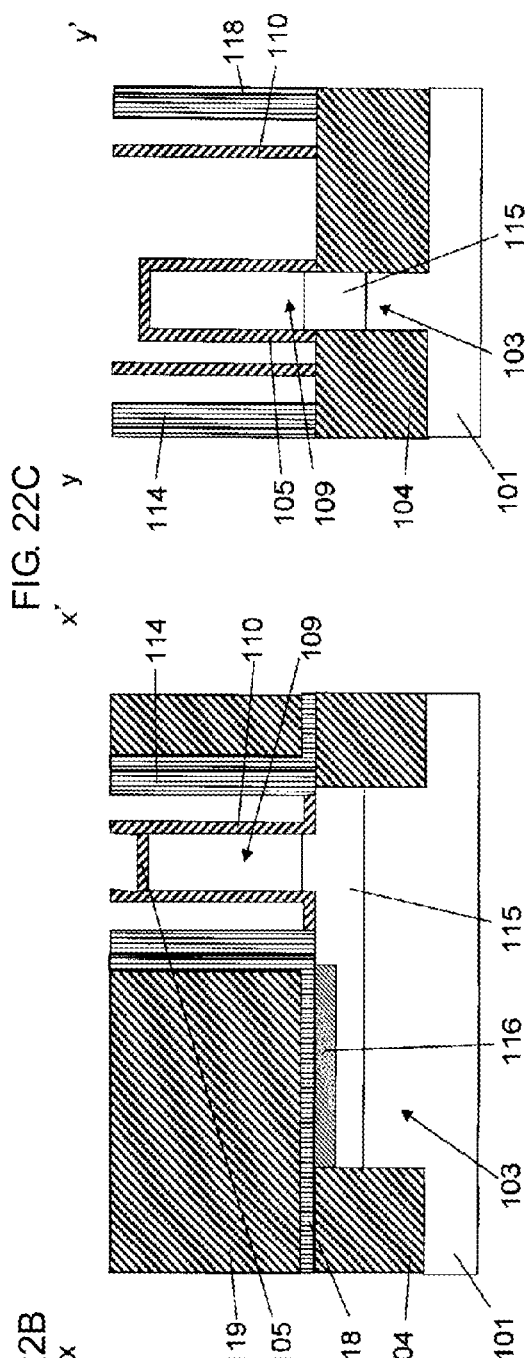
FIG. 22A
FIG. 22B
FIG. 22C

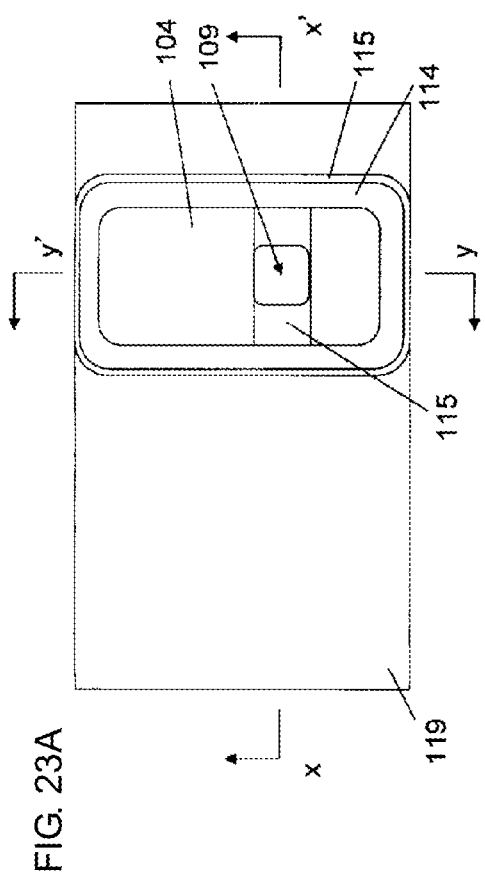
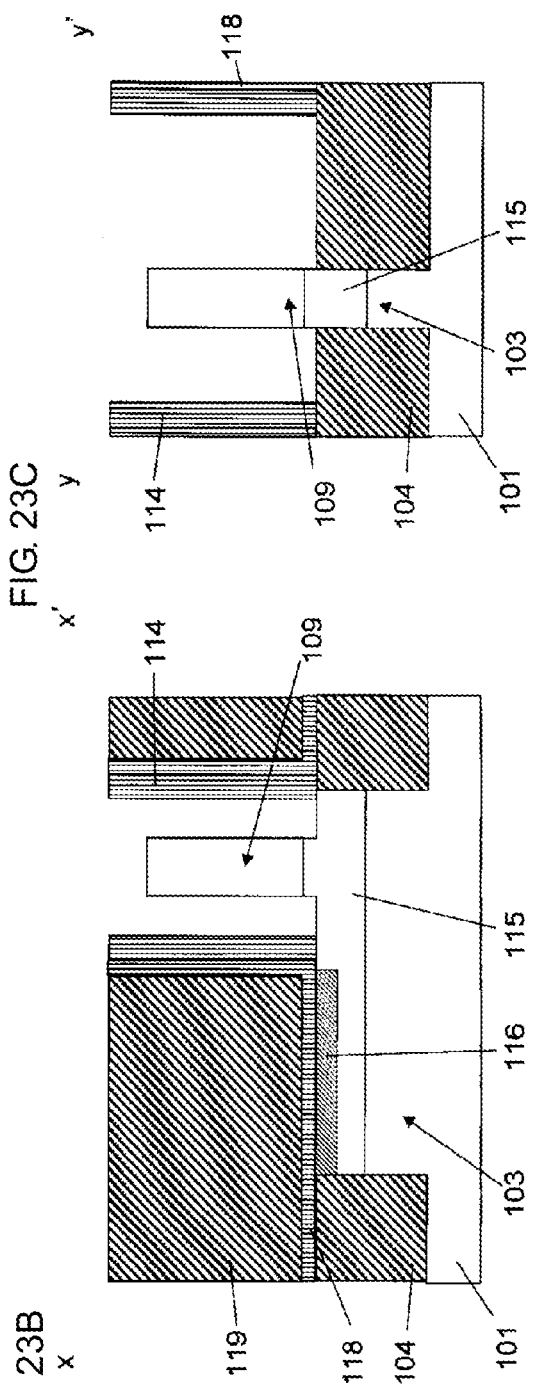
FIG. 23A
FIG. 23B
FIG. 23C

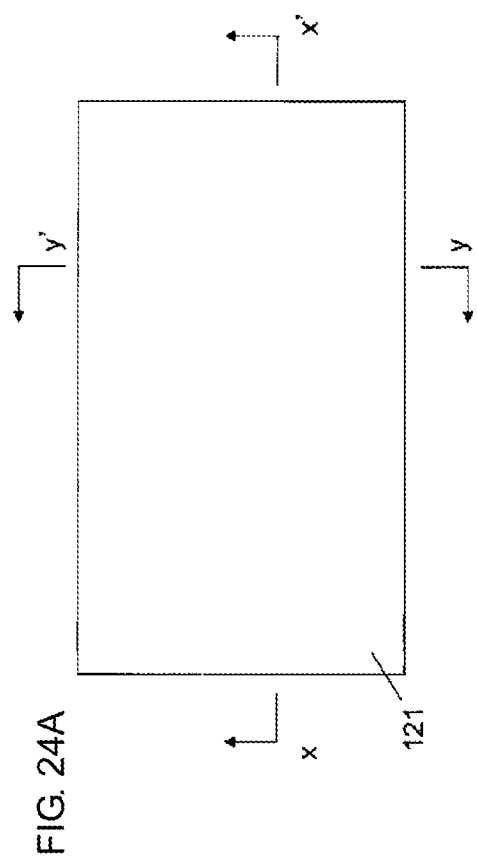
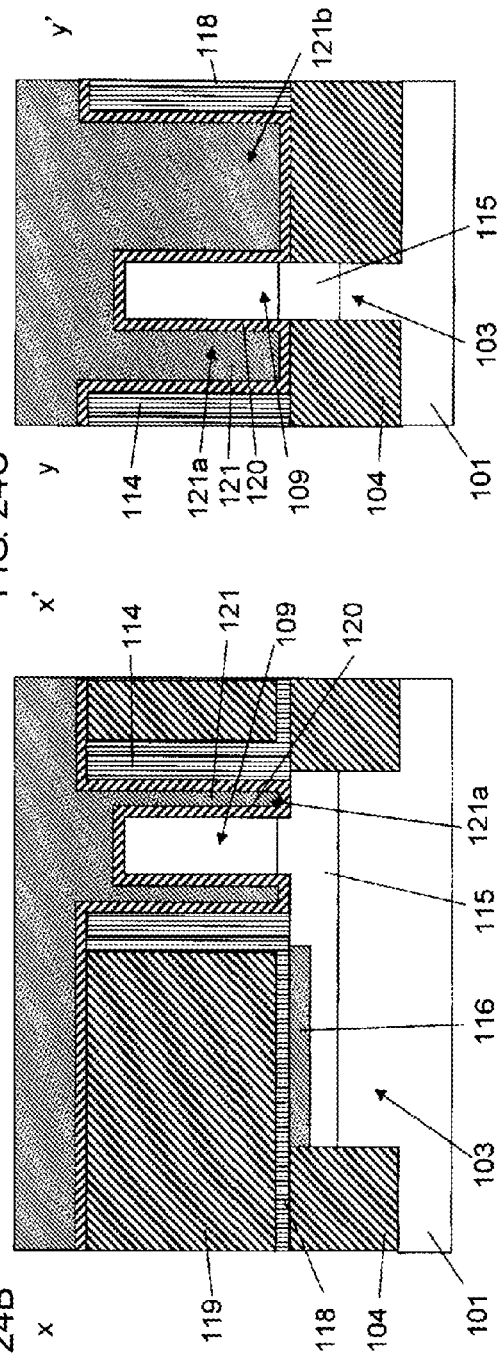
FIG. 24A
FIG. 24B
FIG. 24C

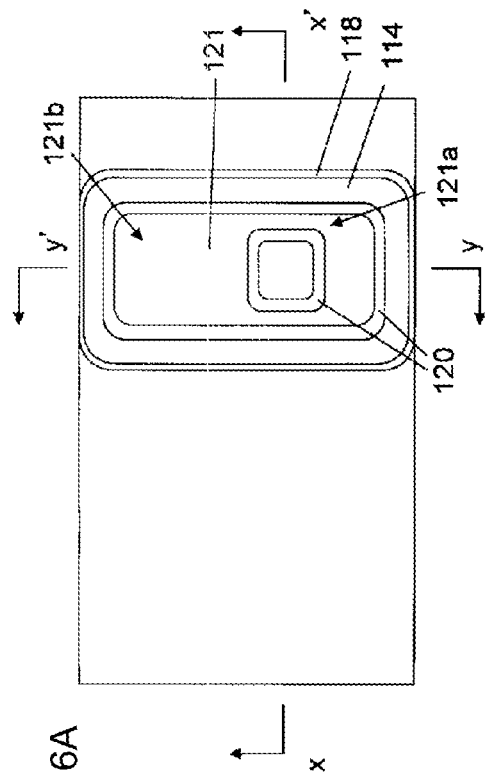
FIG. 26A
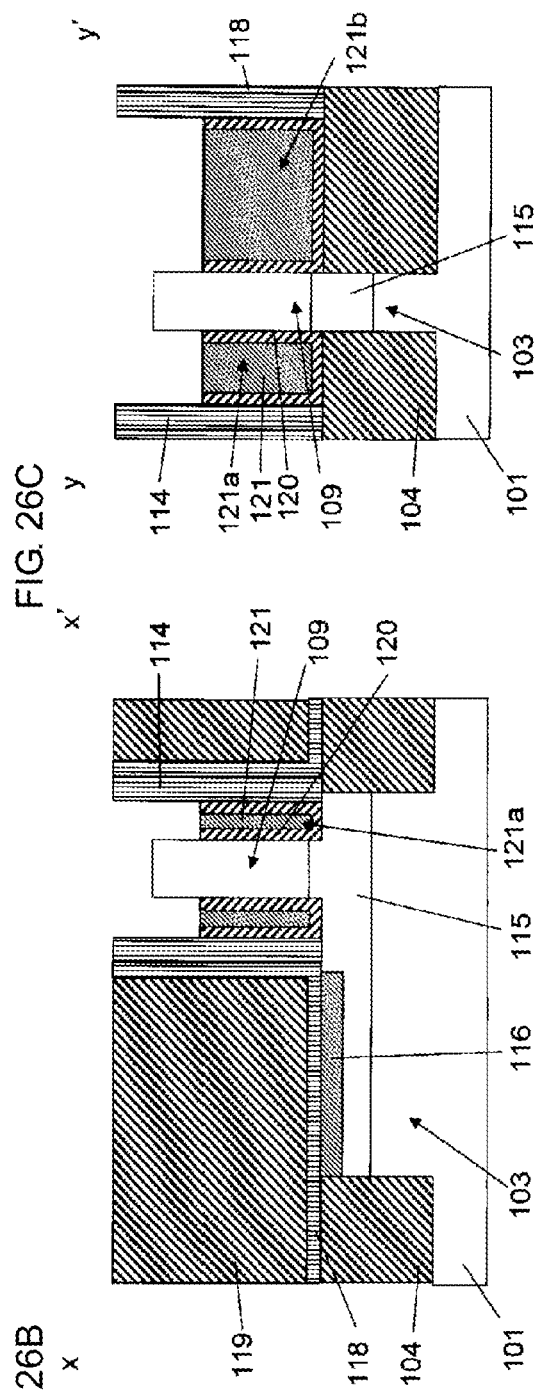
FIG. 26B
FIG. 26C

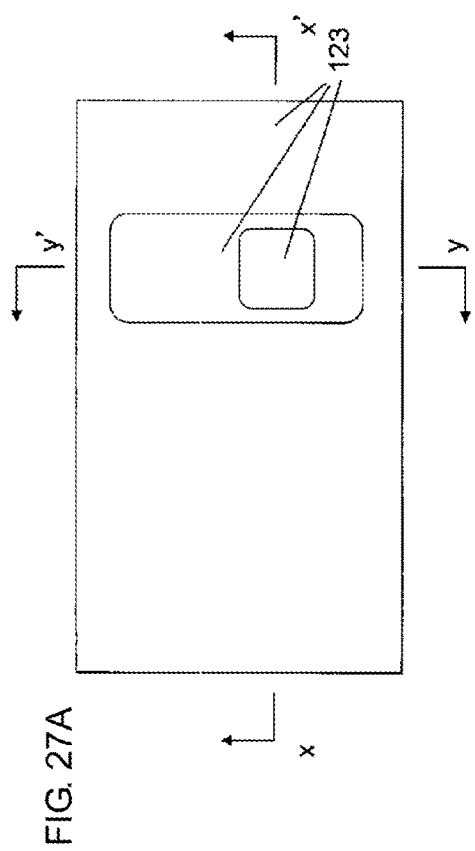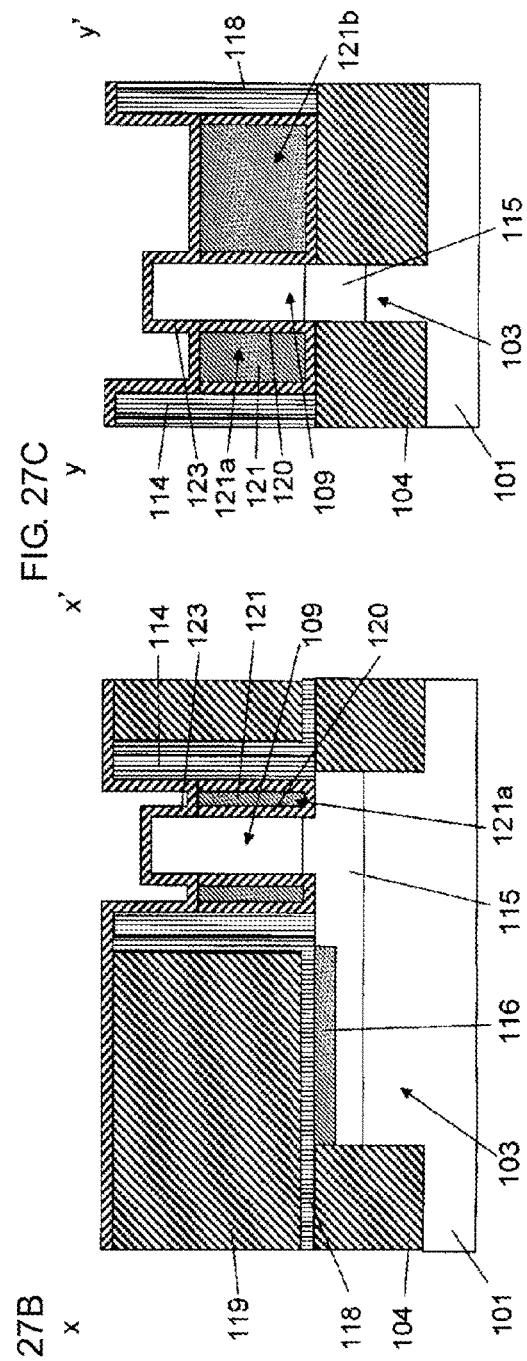
FIG. 27A
FIG. 27B
FIG. 27C

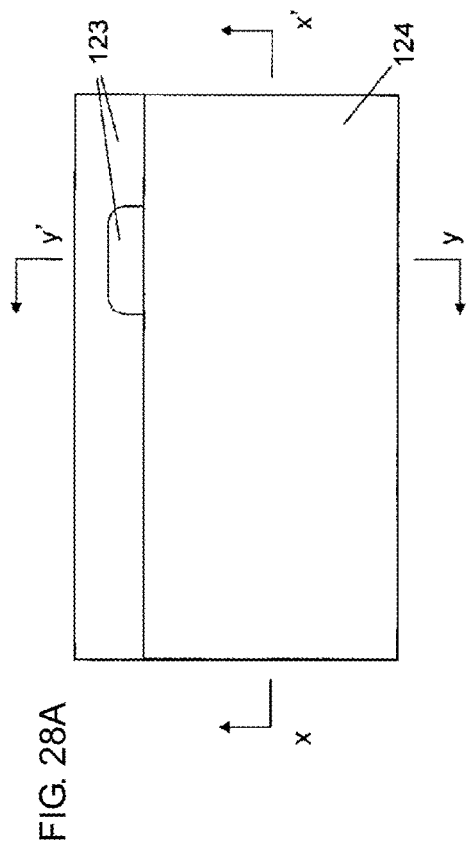
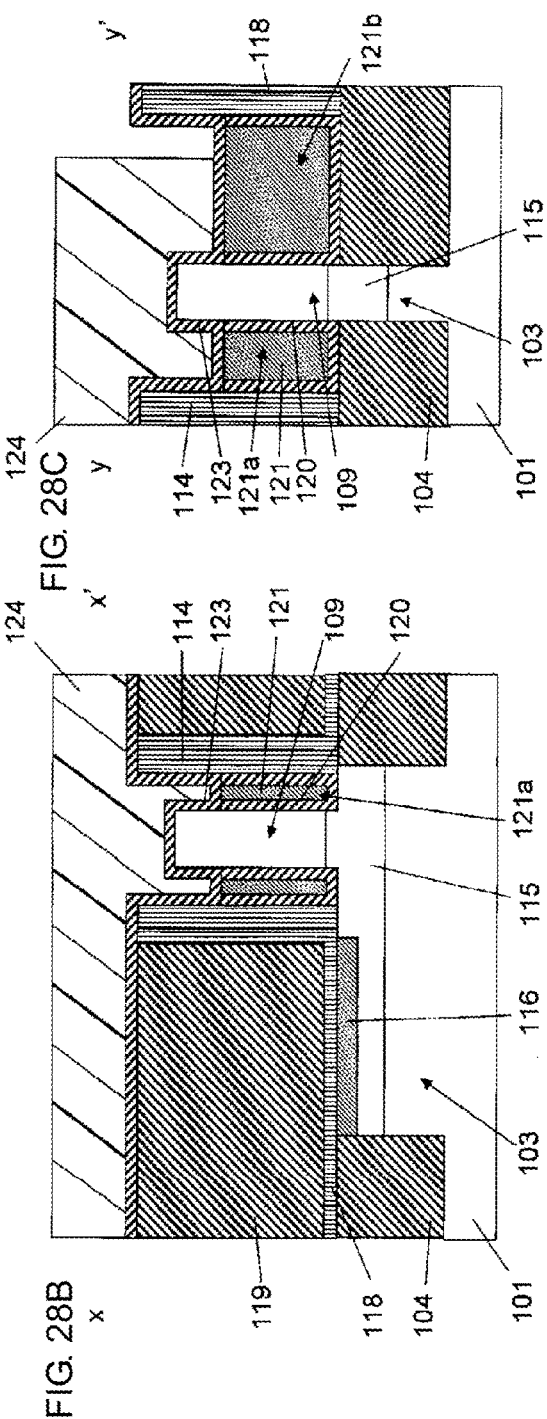
FIG. 28A
FIG. 28B
FIG. 28C

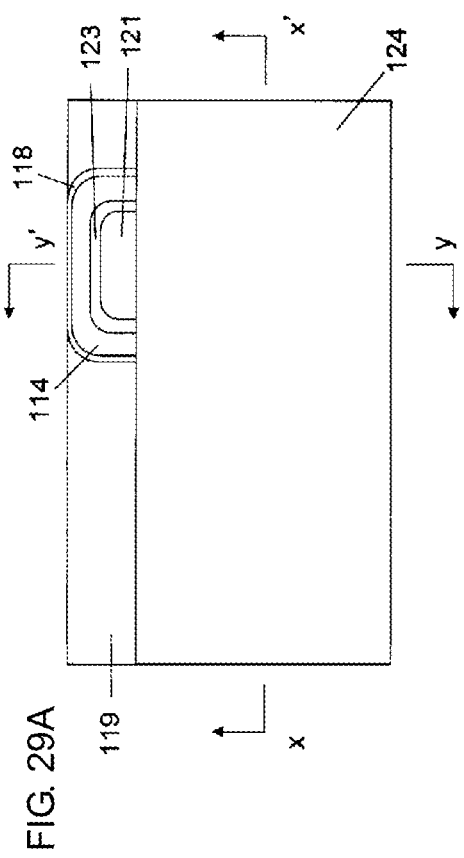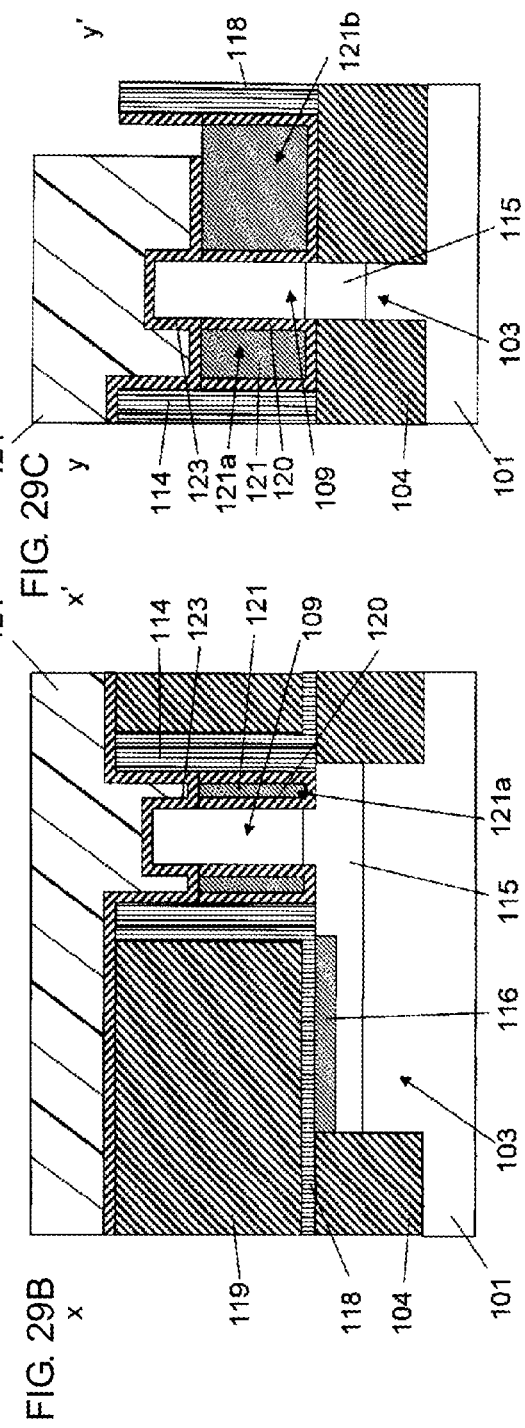

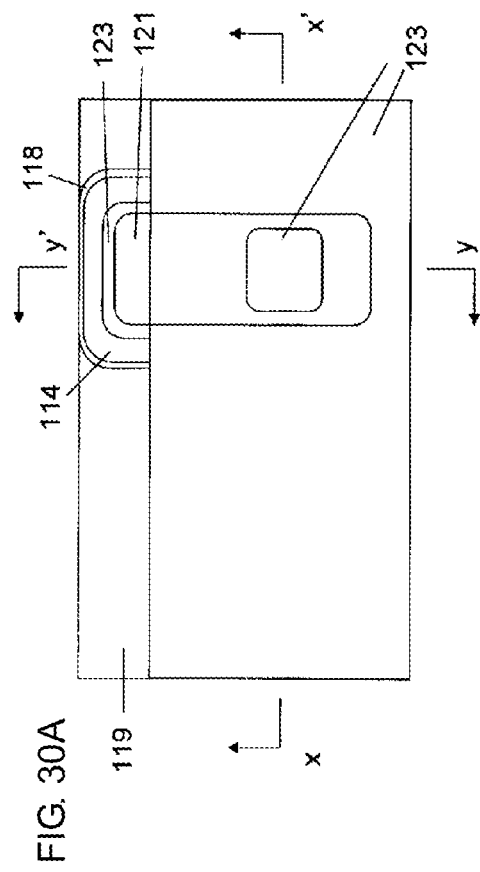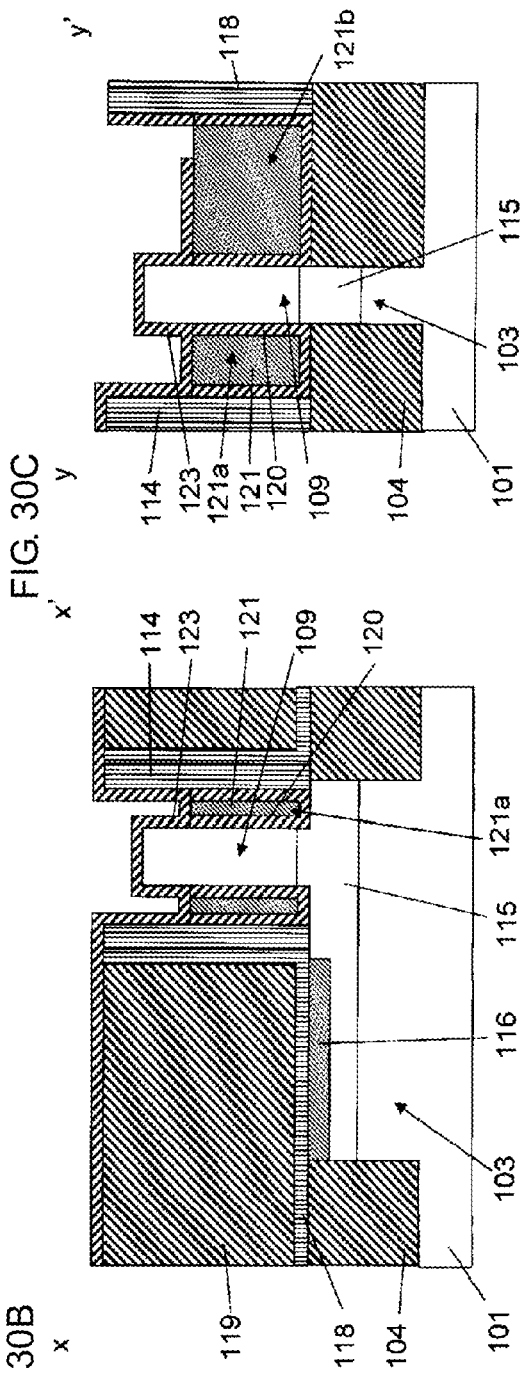

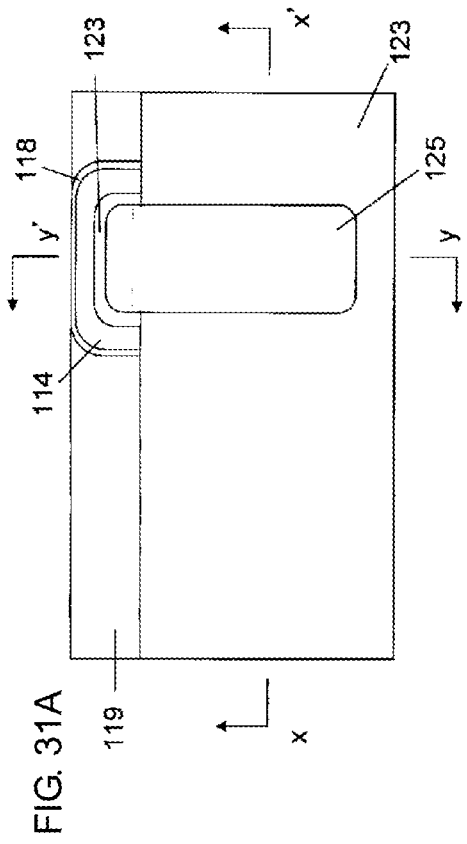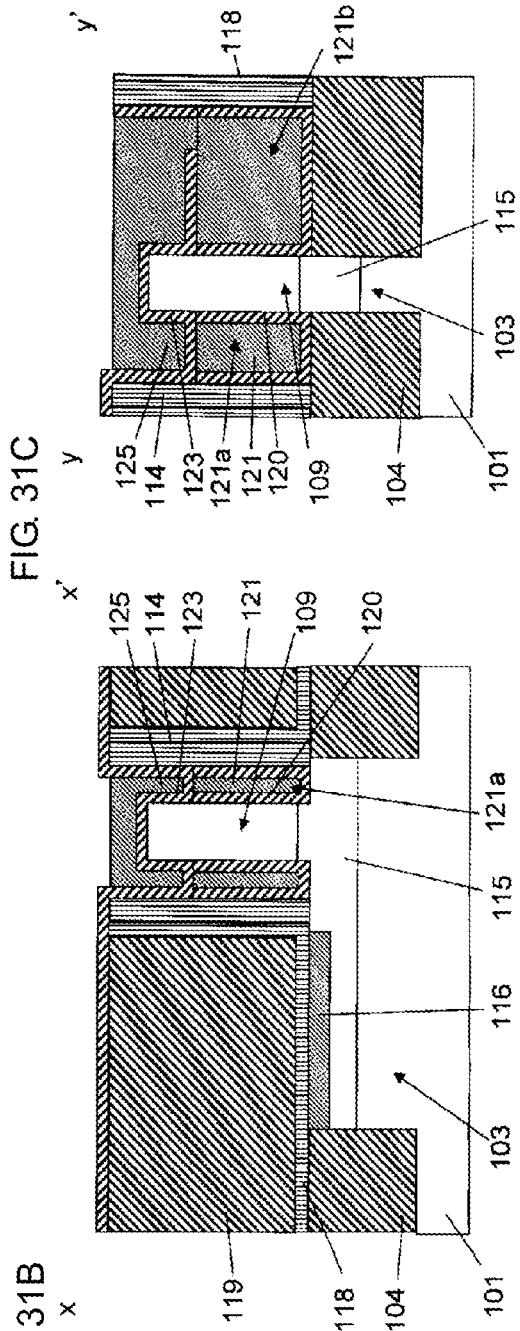

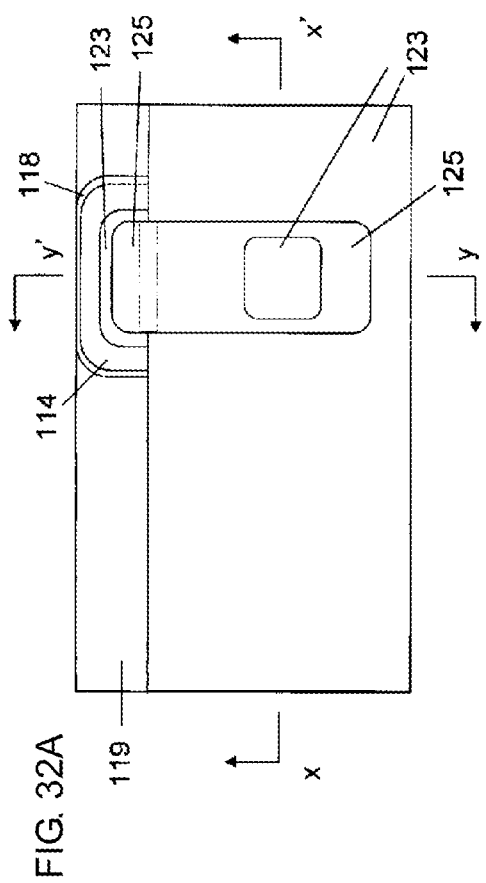
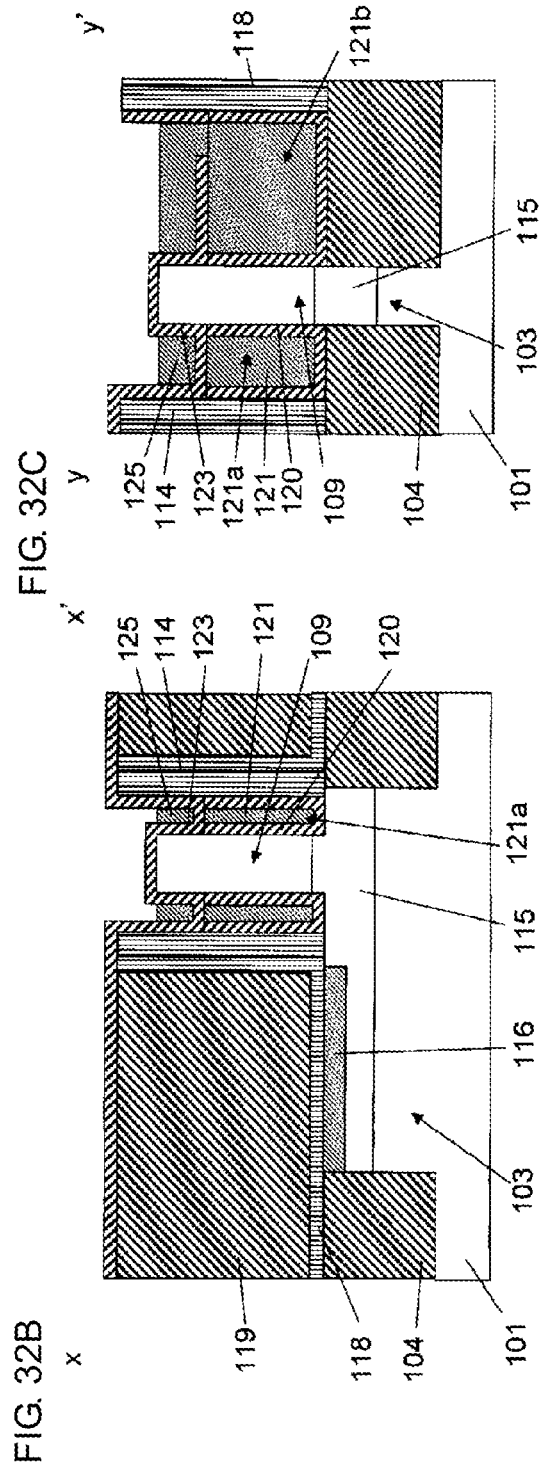
FIG. 32A
FIG. 32B
FIG. 32C

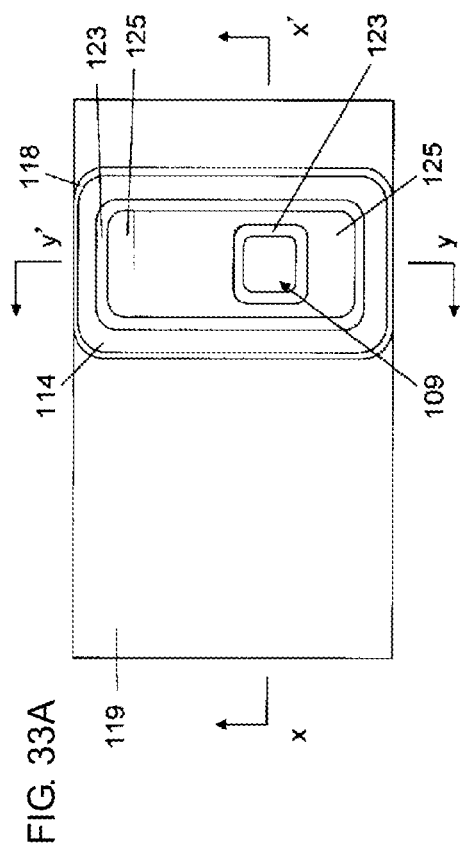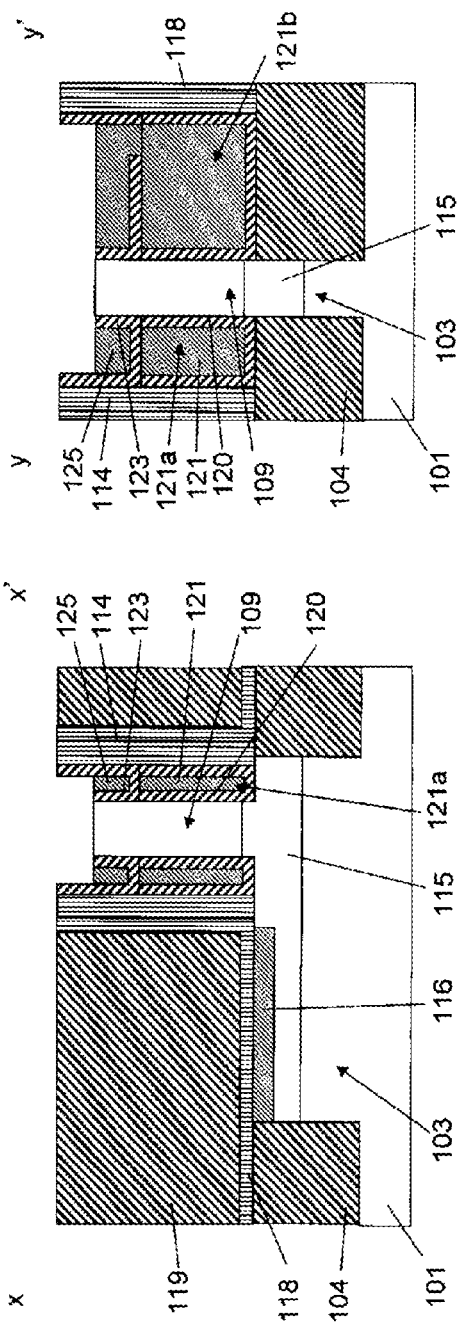
FIG. 33A
FIG. 33B
FIG. 33C

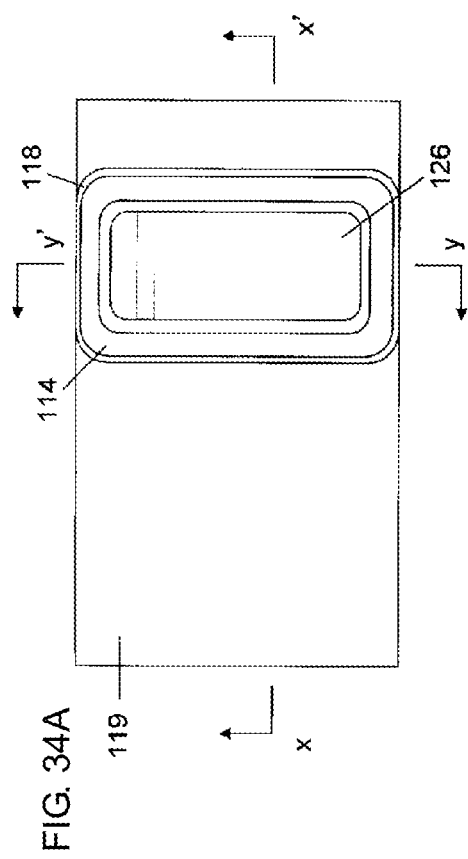
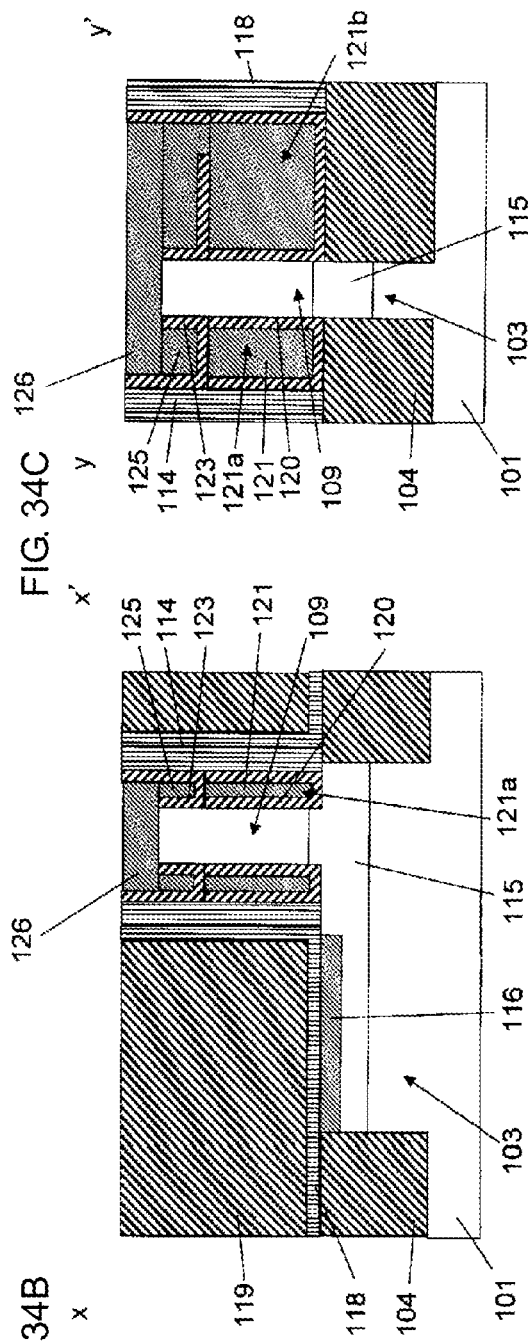
FIG. 34A
FIG. 34B
FIG. 34C

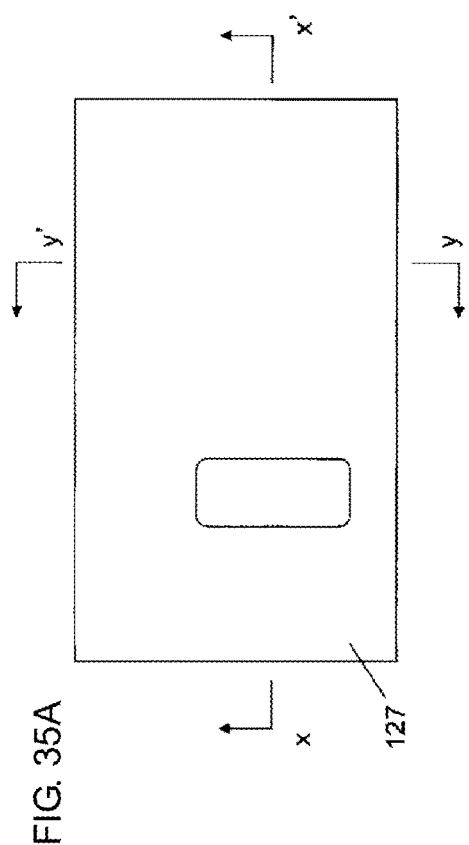
FIG. 35A
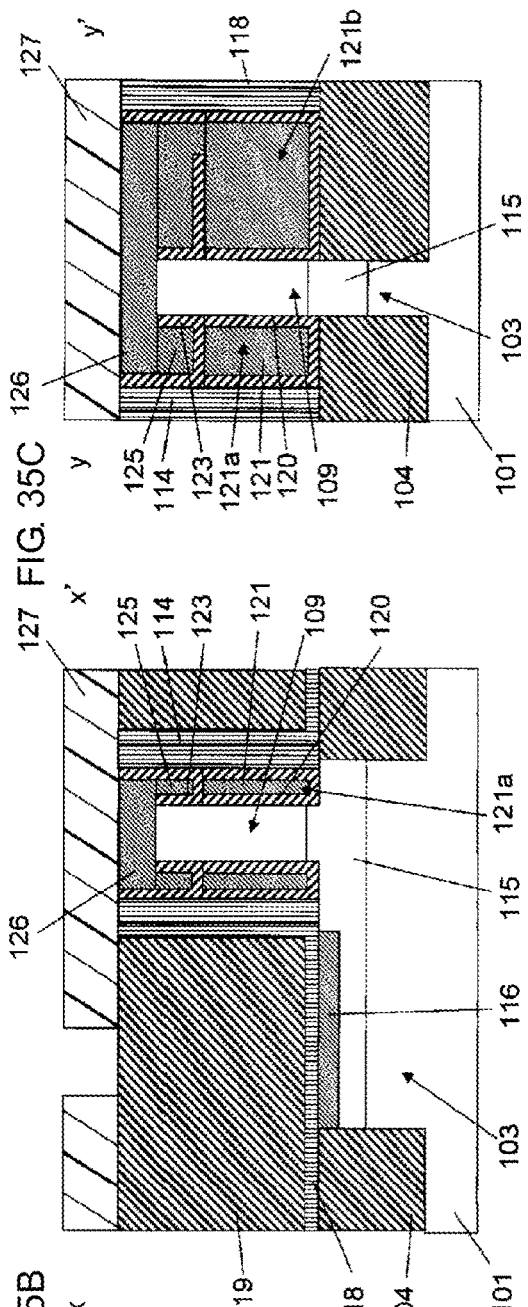
FIG. 35B
FIG. 35C

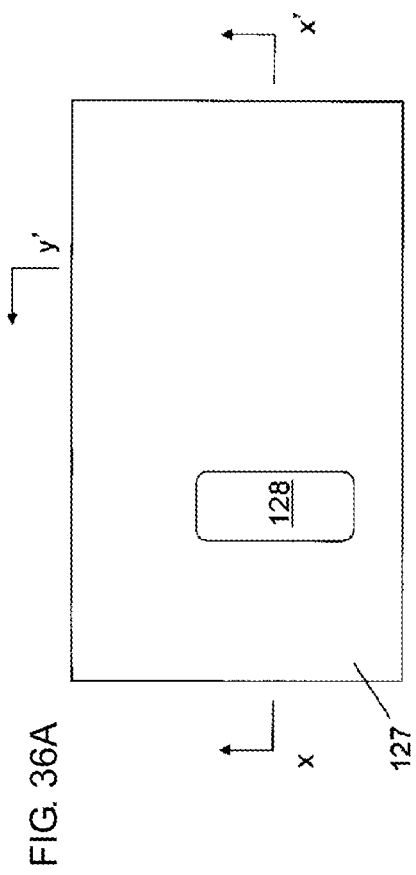
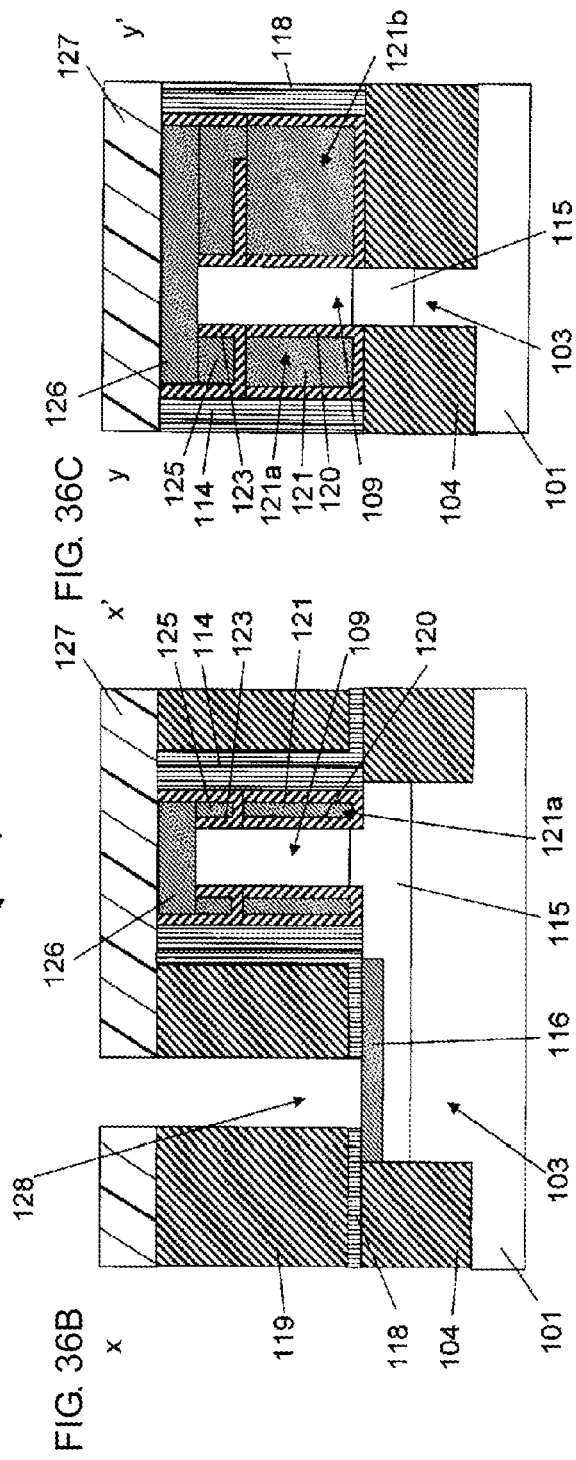
FIG. 36A
FIG. 36B
FIG. 36C

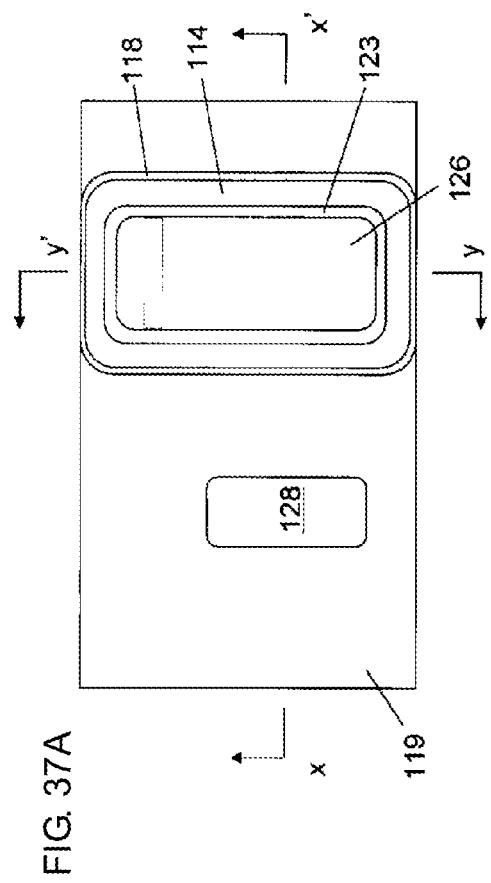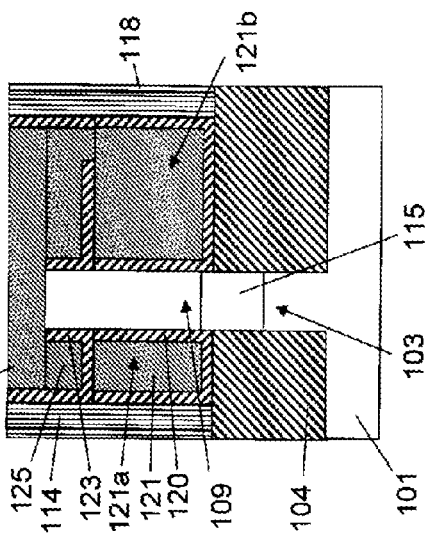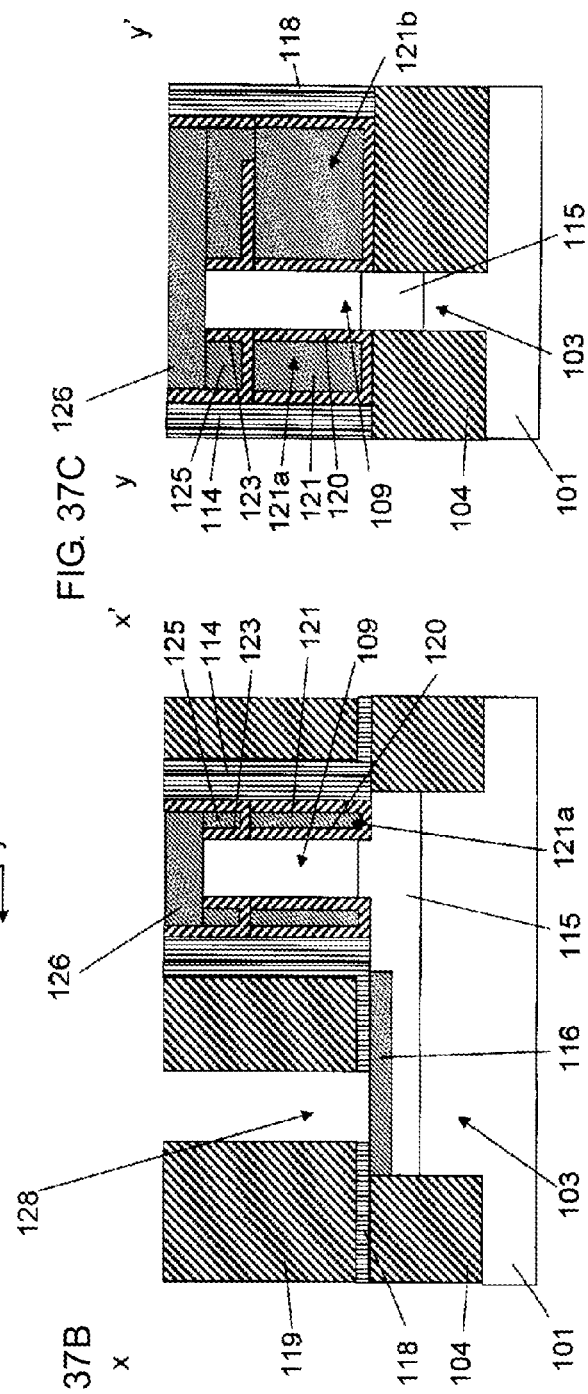
FIG. 37A
FIG. 37B
FIG. 37C

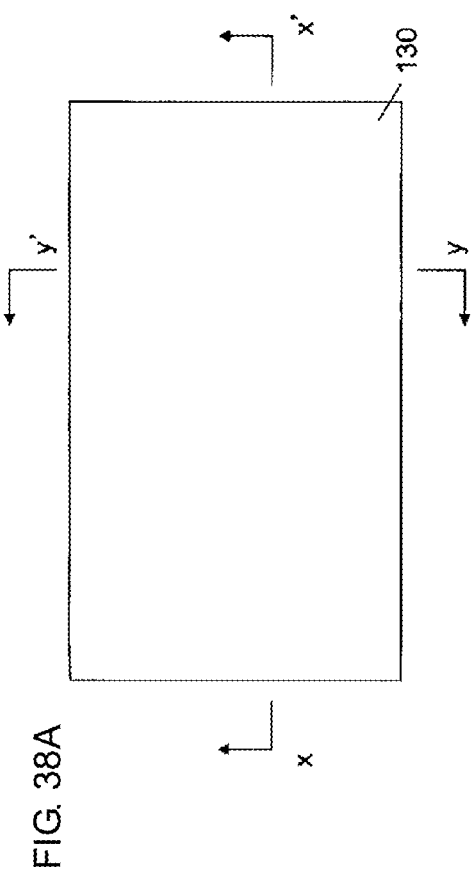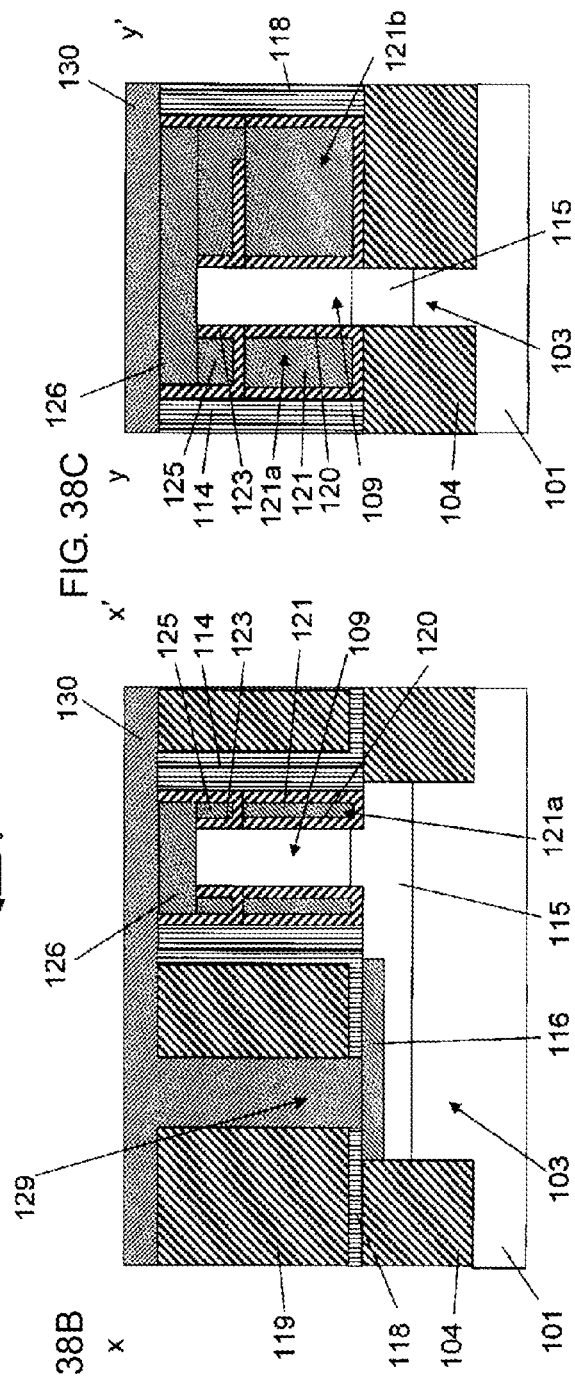

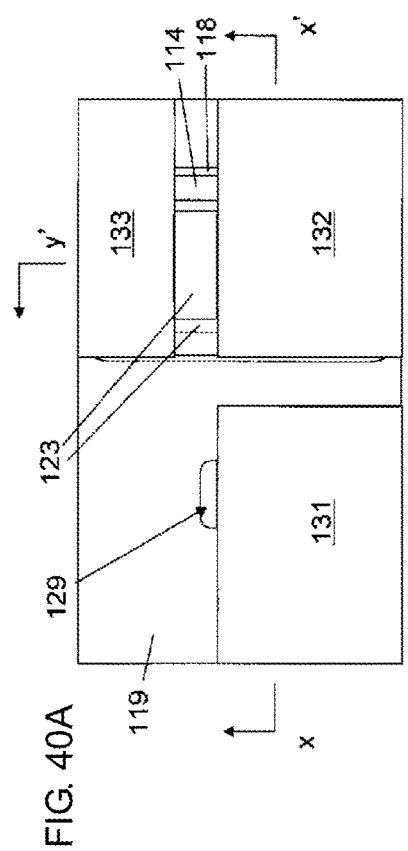
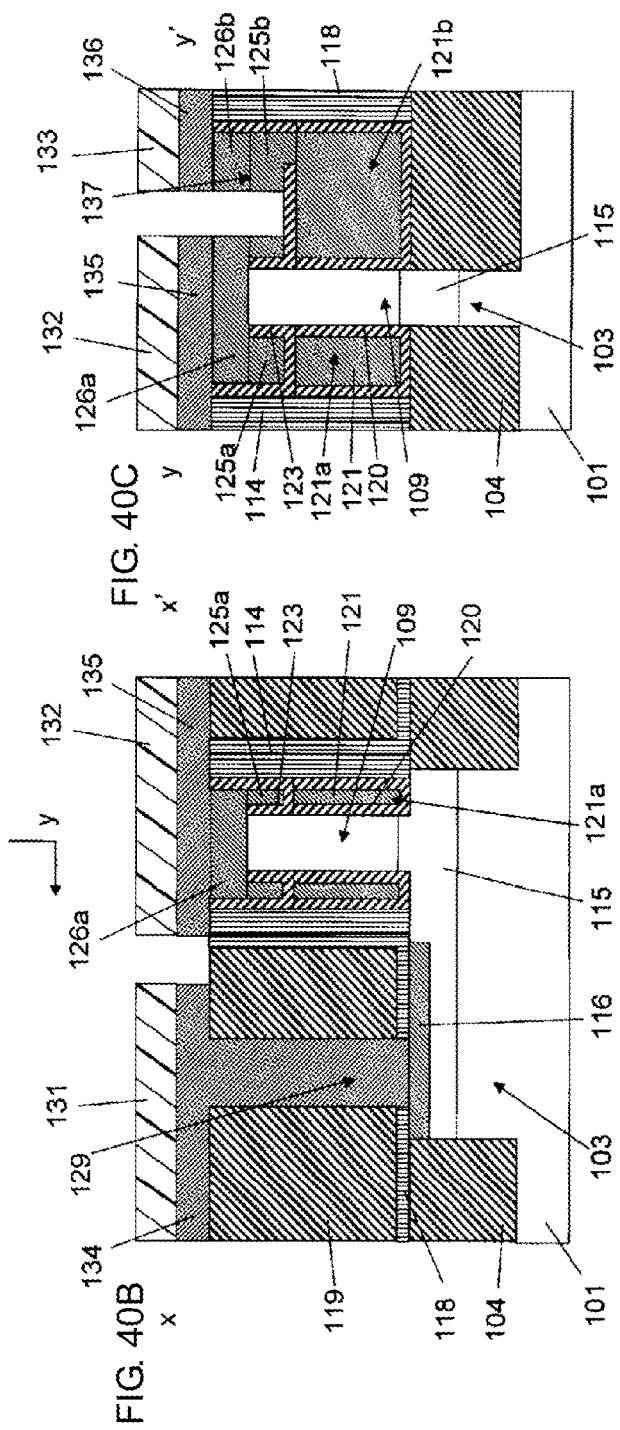

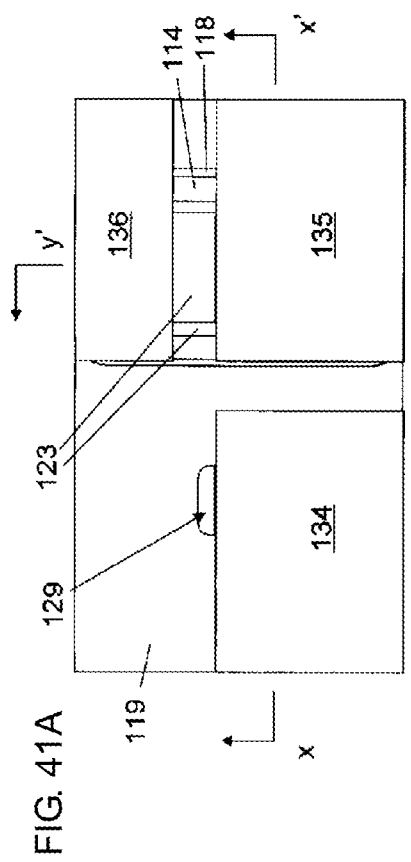
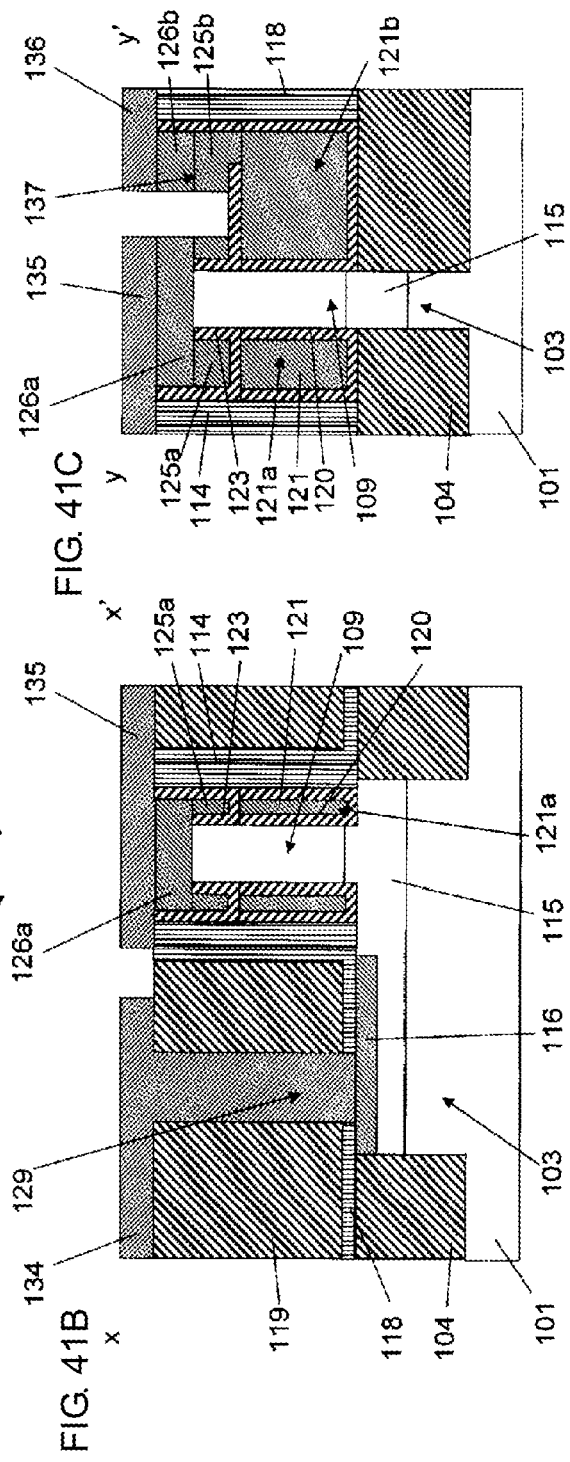

METHOD FOR PRODUCING SEMICONDUCTOR DEVICE

CROSS REFERENCES TO RELATED APPLICATIONS

The present application is a divisional patent application of U.S. application Ser. No. 14/824,633, filed Aug. 12, 2015, which is a continuation application of PCT/JP2013/069666, filed Jul. 19, 2013, the entire contents of which are incorporated herein by reference.

BACKGROUND

1. Technical Field

The present invention relates to a method for producing a semiconductor device.

2. Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as an "SGT") having a structure in which a source, a gate, and a drain are arranged vertically with respect to a substrate and a gate electrode surrounds a pillar-shaped semiconductor layer has been proposed (e.g., refer to Japanese Unexamined Patent Application Publication Nos. 2-71556, 2-188966, and 3-145761).

According to a typical method for producing an SGT, a silicon pillar on which a pillar-shaped nitride film hard mask has been formed is formed by using a mask for forming the silicon pillar, a planar silicon layer is formed at a bottom of the silicon pillar by using a mask for forming the planar silicon layer, and a gate line is formed by using a mask for forming the gate line (e.g., refer to Japanese Unexamined Patent Application Publication No. 2009-182317).

In other words, three masks are used to form a silicon pillar, a planar silicon layer, and a gate line.

A metal gate-last process in which a metal gate is formed after a high-temperature process has been employed in actual production of typical MOS transistors in order to achieve both a metal gate process and a high-temperature process (refer to IEDM 2007, K. Mistry et. al, pp 247-250). A gate is formed using polysilicon, an interlayer insulating film is deposited, the polysilicon gate is exposed by chemical mechanical polishing and etched, and then a metal is deposited. Thus, a metal gate-last process in which a metal gate is formed after a high-temperature process needs to be also employed in making SGTs in order to achieve both a metal gate process and a high-temperature process.

In a metal gate-last process, a diffusion layer is formed by ion implantation after formation of a polysilicon gate. Special consideration is necessary for SGTs because the upper portion of the pillar-shaped silicon layer is covered with a polysilicon gate.

As the width of a silicon pillar decreases, it becomes more difficult to make an impurity be present in the silicon pillar because the density of silicon is $5 \times 10^{22}$/cm$^3$.

In typical SGTs, it has been proposed that the channel concentration is set to be a low impurity concentration of $10^{17}$ cm$^{-3}$ or less and the threshold voltage is determined by changing the work function of a gate material (e.g., refer to Japanese Unexamined Patent Application Publication No. 2004-356314).

It has been disclosed that, in planar MOS transistors, the sidewall of an LDD region is formed of a polycrystalline silicon having the same conductivity type as a low-concentration layer, and therefore surface carriers of the LDD region are induced by the difference in work function and the impedance of the LDD region can be reduced compared with oxide film sidewall LDD-type MOS transistors (e.g., refer to Japanese Unexamined Patent Application Publication No. 11-297984). It has also been disclosed that the polycrystalline silicon sidewall is electrically insulated from a gate electrode. The drawings show that the polycrystalline silicon sidewall is insulated from a source and a drain by an interlayer insulating film.

In typical MOS transistors, a first insulating film is used to decrease parasitic capacitance between the gate line and the substrate. For example, in a FINFET (refer to IEDM 2010 CC. Wu, et. al, 27.1.1-27.1.4), a first insulating film is formed around one fin-shaped semiconductor layer and etched back to expose the fin-shaped semiconductor layer in order to decrease parasitic capacitance between the gate line and the substrate. Accordingly, the first insulating film needs to be also used in an SGT in order to decrease parasitic capacitance between the gate line and the substrate. Since such an SGT includes a pillar-shaped semiconductor layer in addition to a fin-shaped semiconductor layer, special consideration is required to form the pillar-shaped semiconductor layer.

BRIEF SUMMARY

It is desirable to provide a method for producing an SGT which includes forming a fin-shaped semiconductor layer, a pillar-shaped semiconductor layer, a gate electrode, and a gate line using two masks and which employs a gate last process and a self-aligned process, the SGT having a structure in which an upper portion of the pillar-shaped semiconductor layer is made to function as an n-type semiconductor layer or a p-type semiconductor layer by the difference in work function between metal and semiconductor. It is also desirable to provide an SGT structure obtained by this method.

A method for producing a semiconductor device according to a first aspect of the present invention includes a first step of forming a fin-shaped semiconductor layer on a semiconductor substrate and forming a first insulating film around the fin-shaped semiconductor layer; a second step following the first step, the second step including forming a pillar-shaped semiconductor layer and a first dummy gate formed of a first polysilicon; a third step following the second step, the third step including forming a second dummy gate on sidewalls of the first dummy gate and the pillar-shaped semiconductor layer; a fourth step following the third step, the fourth step including forming a fifth insulating film left as a sidewall around the second dummy gate, forming a second diffusion layer in an upper portion of the fin-shaped semiconductor layer and a lower portion of the pillar-shaped semiconductor layer, and forming a metal-semiconductor compound on the second diffusion layer; a fifth step following the fourth step, the fifth step including depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on inner sides of the fifth insulating film, depositing a first metal, and forming a gate electrode and a gate line; and a sixth step following the fifth step, the sixth step including depositing a second gate insulating film around the pillar-shaped semiconductor layer and on the gate electrode and the gate line, removing a portion of the second gate insulating film on the gate line, depositing a second metal, etching back the second metal, removing the second gate insulating film on the pillar-shaped semiconductor layer, depositing a third metal, and etching a portion of the third metal and a portion of the second metal to form a first contact in which the second metal surrounds a sidewall of an upper portion of the pillar-shaped semiconductor layer, a second contact that connects an upper portion of the first contact and an upper portion of the pillar-shaped semiconductor layer, and a third contact made of the second metal and the third metal and formed on the gate line.

The second step may include forming a second insulating film around the fin-shaped semiconductor layer, depositing the first polysilicon on the second insulating film to perform planarization, forming a second resist for forming the gate line and the pillar-shaped semiconductor layer so that the second resist extends in a direction perpendicular to a direction in which the fin-shaped semiconductor layer extends, and etching the first polysilicon, the second insulating film, and the fin-shaped semiconductor layer to form the pillar-shaped semiconductor layer and the first dummy gate formed of the first polysilicon.

The third step may include forming a fourth insulating film around the pillar-shaped semiconductor layer and the first dummy gate, depositing a second polysilicon around the fourth insulating film, and etching the second polysilicon so that the second polysilicon is left on sidewalls of the first dummy gate and the pillar-shaped semiconductor layer to form the second dummy gate.

The fourth step may include forming the fifth insulating film around the second dummy gate, etching the fifth insulating film into a sidewall shape so that a sidewall formed of the fifth insulating film is formed, forming the second diffusion layer in the upper portion of the fin-shaped semiconductor layer and the lower portion of the pillar-shaped semiconductor layer, and forming the metal-semiconductor compound on the second diffusion layer.

The fifth step may include depositing an interlayer insulating film, performing chemical mechanical polishing to expose an upper portion of the second dummy gate and an upper portion of the first dummy gate, removing the second dummy gate and the first dummy gate, removing the fourth insulating film, forming a first gate insulating film around the pillar-shaped semiconductor layer and on inner sides of the fifth insulating film, depositing a first metal, and etching back the first metal to form the gate electrode and the gate line.

The second step may further include forming a third insulating film on the first polysilicon after depositing the first polysilicon on the second insulating film to perform planarization.

The method may further include, after the fourth step, depositing a contact stopper film.

The method may further include, after the fifth step, removing the first gate insulating film.

A metal that forms the first contact may have a work function of 4.0 eV to 4.2 eV.

A metal that forms the first contact may have a work function of 5.0 eV to 5.2 eV.

A semiconductor device according to a second aspect of the present invention includes a pillar-shaped semiconductor layer; a first gate insulating film formed around the pillar-shaped semiconductor layer; a gate electrode made of a metal and formed around the first gate insulating film; a gate line made of a metal and connected to the gate electrode; a second gate insulating film formed around a sidewall of an upper portion of the pillar-shaped semiconductor layer; a first contact made of a second metal and formed around the second gate insulating film; a second contact made of a third metal and connecting an upper portion of the first contact and an upper portion of the pillar-shaped semiconductor layer; and a third contact made of the second metal and the third metal and formed on the gate line.

The semiconductor device may include a fin-shaped semiconductor layer formed on a semiconductor substrate; a first insulating film formed around the fin-shaped semiconductor layer; and a second diffusion layer formed in an upper portion of the fin-shaped semiconductor layer and a lower portion of the pillar-shaped semiconductor layer. The pillar-shaped semiconductor layer is formed on the fin-shaped semiconductor layer, the first gate insulating film is formed around and at bottoms of the gate electrode and the gate line, and the gate line extends in a direction perpendicular to a direction in which the fin-shaped semiconductor layer extends.

A width of the first contact in a direction perpendicular to a direction in which the gate line extends may be equal to a width of the third contact in the direction perpendicular to the direction in which the gate line extends.

A width of the first contact in a direction perpendicular to a direction in which the gate line extends may be equal to a width of the gate line in the direction perpendicular to the direction in which the gate line extends.

A width of the third contact in a direction perpendicular to a direction in which the gate line extends may be equal to a width of the gate line in the direction perpendicular to the direction in which the gate line extends.

A width of the first contact in a direction perpendicular to a direction in which the gate line extends may be equal to a width of the second contact in the direction perpendicular to the direction in which the gate line extends.

The second gate insulating film may be formed around and at a bottom of the first contact.

The second metal that forms the first contact may have a work function of 4.0 eV to 4.2 eV.

The second metal that forms the first contact may have a work function of 5.0 eV to 5.2 eV.

The present invention can provide a method for producing an SGT which includes forming a fin-shaped semiconductor layer, a pillar-shaped semiconductor layer, a gate electrode, and a gate line using two masks and which employs a gate last process and a self-aligned process, the SGT having a structure in which an upper portion of the pillar-shaped semiconductor layer is made to function as an n-type semiconductor layer or a p-type semiconductor layer by the difference in work function between metal and semiconductor. The present invention can also provide an SGT structure obtained by the method.

A fin-shaped semiconductor layer, a pillar-shaped semiconductor layer, and first and second dummy gates which will later form a gate electrode and a gate line can be formed using two masks through the following steps: the first step of forming a fin-shaped semiconductor layer on a semiconductor substrate and forming a first insulating film around the fin-shaped semiconductor layer; the second step following the first step, the second step including forming a pillar-shaped semiconductor layer and a first dummy gate formed of a first polysilicon; the third step following the second step, the third step including forming a second dummy gate on sidewalls of the first dummy gate and the pillar-shaped semiconductor layer; the fourth step following the third step, the fourth step including forming a fifth insulating film left as a sidewall around the second dummy gate, forming a second diffusion layer in an upper portion of the fin-shaped semiconductor layer and a lower portion of the pillar-shaped semiconductor layer, and forming a metal-semiconductor compound on the second diffusion layer; and the fifth step following the fourth step, the fifth step including depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on inner sides of the fifth insulating film, depositing a first metal, and etching back the first metal to form a gate electrode and a gate line. Thus, the number of steps can be decreased.

Misalignment between the pillar-shaped semiconductor layer and the gate line can be eliminated.

Furthermore, a metal gate SGT can be easily formed because a typical metal gate-last production process can be used which includes forming a first dummy gate and a second dummy gate using polysilicon, depositing an interlayer insulating film, exposing the first dummy gate and the second dummy gate by chemical mechanical etching, etching the polysilicon gate, and then depositing a metal.

There is no need to form a diffusion layer in an upper portion of the pillar-shaped semiconductor layer due to the sixth step that follows the fifth step and includes removing the exposed first gate insulating film, depositing a second gate insulating film around the pillar-shaped semiconductor layer and on the gate electrode and the gate line, removing a portion of the second gate insulating film on the gate line, depositing a second metal, etching back the second metal, removing the second gate insulating film on the pillar-shaped semiconductor layer, depositing a third metal, and etching a portion of the third metal and a portion of the second metal to form a first contact in which the second metal surrounds a sidewall of an upper portion of the pillar-shaped semiconductor layer, a second contact that connects an upper portion of the first contact and an upper portion of the pillar-shaped semiconductor layer, and a third contact made of the second metal and the third metal and formed on the gate line. At the same time, a contact on the gate line can also be formed.

After the fifth step, a hole having the same shape as those of the gate electrode and the gate line is left above the gate electrode and the gate line. Therefore, the hole having the same shape as those of the gate electrode and the gate line is filled with a metal by removing the exposed first gate insulating film, depositing a second gate insulating film around the pillar-shaped semiconductor layer and on the gate electrode and the gate line, removing a portion of the second gate insulating film on the gate line, depositing a second metal, and etching back the second metal. As a result, a first contact in which the second metal surrounds a sidewall of an upper portion of the pillar-shaped semiconductor layer can be formed by self-alignment.

Since a portion of the second gate insulating film on the gate line is removed, a third contact for the gate line can be formed at the same time. Thus, a contact for the gate line can be easily formed.

If a metal gate-last process is used for an SGT, an upper portion of the pillar-shaped semiconductor layer is covered with a polysilicon gate. Therefore, it is difficult to form a diffusion layer in the upper portion of the pillar-shaped semiconductor layer. This requires formation of a diffusion layer in the upper portion of the pillar-shaped semiconductor layer before formation of a polysilicon gate. In contrast, according to the present invention, the upper portion of the pillar-shaped semiconductor layer can be made to function as an n-type semiconductor layer or a p-type semiconductor layer by the difference in work function between metal and semiconductor without forming a diffusion layer in the upper portion of the pillar-shaped semiconductor layer. Accordingly, a step of forming a diffusion layer in the upper portion of the pillar-shaped semiconductor layer can be omitted.

The first gate insulating film formed around and at bottoms of the gate electrode and the gate line can insulate the gate electrode and the gate line from the pillar-shaped semiconductor layer and the fin-shaped semiconductor layer.

After the fifth step, the first contact, the second contact, and the third contact are formed by filling a hole which is present above the gate electrode and the gate line and which has the same shape as those of the gate electrode and the gate line. Therefore, the width of the first contact in a direction perpendicular to a direction in which the gate line extends is equal to the width of the third contact in the direction perpendicular the direction in which the gate line extends. The width of the first contact in the direction perpendicular to the direction in which the gate line extends is equal to the width of the gate line in the direction perpendicular to the direction in which the gate line extends. The width of the third contact in the direction perpendicular to the direction in which the gate line extends is equal to the width of the gate line in the direction perpendicular to the direction in which the gate line extends. The width of the first contact in the direction perpendicular to the direction in which the gate line extends is equal to the width of the second contact in the direction perpendicular to the direction in which the gate line extends.

Accordingly, misalignment between the first contact, the second contact, and the third contact can be eliminated in a direction perpendicular to the direction in which the gate line extends.

BRIEF DESCRIPTION OF THE DRAWING

FIG. 1A is a plan view illustrating a semiconductor device according to an embodiment of the present invention, FIG. 1B is a sectional view taken along line X-X' in FIG. 1A, and FIG. 1C is a sectional view taken along line Y-Y' in FIG. 1A.

FIG. 2A is a plan view illustrating a method for producing a semiconductor device according to an embodiment of the present invention, FIG. 2B is a sectional view taken along line X-X' in FIG. 2A, and FIG. 2C is a sectional view taken along line Y-Y' in FIG. 2A.

FIG. 3A is a plan view illustrating a method for producing a semiconductor device according to an embodiment of the present invention, FIG. 3B is a sectional view taken along line X-X' in FIG. 3A, and FIG. 3C is a sectional view taken along line Y-Y' in FIG. 3A.

FIG. 4A is a plan view illustrating a method for producing a semiconductor device according to an embodiment of the present invention, FIG. 4B is a sectional view taken along line X-X' in FIG. 4A, and FIG. 4C is a sectional view taken along line Y-Y' in FIG. 4A.

FIG. 5A is a plan view illustrating a method for producing a semiconductor device according to an embodiment of the present invention, FIG. 5B is a sectional view taken along line X-X' in FIG. 5A, and FIG. 5C is a sectional view taken along line Y-Y' in FIG. 5A.

FIG. 7A is a plan view illustrating a method for producing a semiconductor device according to an embodiment of the present invention, FIG. 7B is a sectional view taken along line X-X' in FIG. 7A, and FIG. 7C is a sectional view taken along line Y-Y' in FIG. 7A.

FIG. 8A is a plan view illustrating a method for producing a semiconductor device according to an embodiment of the present invention, FIG. 8B is a sectional view taken along line X-X' in FIG. 8A, and FIG. 8C is a sectional view taken along line Y-Y' in FIG. 8A.

FIG. 9A is a plan view illustrating a method for producing a semiconductor device according to an embodiment of the present invention, FIG. 9B is a sectional view taken along line X-X' in FIG. 9A, and FIG. 9C is a sectional view taken along line Y-Y' in FIG. 9A.

FIG. 10A is a plan view illustrating a method for producing a semiconductor device according to an embodiment of the present invention, FIG. 10B is a sectional view taken along line X-X' in FIG. 10A, and FIG. 10C is a sectional view taken along line Y-Y' in FIG. 10A.

FIG. 11A is a plan view illustrating a method for producing a semiconductor device according to an embodiment of the present invention, FIG. 11B is a sectional view taken along line X-X' in FIG. 11A, and FIG. 11C is a sectional view taken along line Y-Y' in FIG. 11A.

FIG. 12A is a plan view illustrating a method for producing a semiconductor device according to an embodiment of the present invention, FIG. 12B is a sectional view taken along line X-X' in FIG. 12A, and FIG. 12C is a sectional view taken along line Y-Y' in FIG. 12A.

FIG. 14A is a plan view illustrating a method for producing a semiconductor device according to an embodiment of the present invention, FIG. 14B is a sectional view taken along line X-X' in FIG. 14A, and FIG. 14C is a sectional view taken along line Y-Y' in FIG. 14A.

FIG. 15A is a plan view illustrating a method for producing a semiconductor device according to an embodiment of the present invention, FIG. 15B is a sectional view taken along line X-X' in FIG. 15A, and FIG. 15C is a sectional view taken along line Y-Y' in FIG. 15A.

FIG. 16A is a plan view illustrating a method for producing a semiconductor device according to an embodiment of the present invention, FIG. 16B is a sectional view taken along line X-X' in FIG. 16A, and FIG. 16C is a sectional view taken along line Y-Y' in FIG. 16A.

FIG. 17A is a plan view illustrating a method for producing a semiconductor device according to an embodiment of the present invention, FIG. 17B is a sectional view taken along line X-X' in FIG. 17A, and FIG. 17C is a sectional view taken along line Y-Y' in FIG. 17A.

FIG. 18A is a plan view illustrating a method for producing a semiconductor device according to an embodiment of the present invention, FIG. 18B is a sectional view taken along line X-X' in FIG. 18A, and FIG. 18C is a sectional view taken along line Y-Y' in FIG. 18A.

FIG. 19A is a plan view illustrating a method for producing a semiconductor device according to an embodiment of the present invention, FIG. 19B is a sectional view taken along line X-X' in FIG. 19A, and FIG. 19C is a sectional view taken along line Y-Y' in FIG. 19A.

FIG. 20A is a plan view illustrating a method for producing a semiconductor device according to an embodiment of the present invention, FIG. 20B is a sectional view taken along line X-X' in FIG. 20A, and FIG. 20C is a sectional view taken along line Y-Y' in FIG. 20A.

FIG. 21A is a plan view illustrating a method for producing a semiconductor device according to an embodiment of the present invention, FIG. 21B is a sectional view taken along line X-X' in FIG. 21A, and FIG. 21C is a sectional view taken along line Y-Y' in FIG. 21A.

FIG. 22A is a plan view illustrating a method for producing a semiconductor device according to an embodiment of the present invention, FIG. 22B is a sectional view taken along line X-X' in FIG. 22A, and FIG. 22C is a sectional view taken along line Y-Y' in FIG. 22A.

FIG. 23A is a plan view illustrating a method for producing a semiconductor device according to an embodiment of the present invention, FIG. 23B is a sectional view taken along line X-X' in FIG. 23A, and FIG. 23C is a sectional view taken along line Y-Y' in FIG. 23A.

FIG. 24A is a plan view illustrating a method for producing a semiconductor device according to an embodiment of the present invention, FIG. 24B is a sectional view taken along line X-X' in FIG. 24A, and FIG. 24C is a sectional view taken along line Y-Y' in FIG. 24A.

FIG. 26A is a plan view illustrating a method for producing a semiconductor device according to an embodiment of the present invention, FIG. 26B is a sectional view taken along line X-X' in FIG. 26A, and FIG. 26C is a sectional view taken along line Y-Y' in FIG. 26A.

FIG. 27A is a plan view illustrating a method for producing a semiconductor device according to an embodiment of the present invention, FIG. 27B is a sectional view taken along line X-X' in FIG. 27A, and FIG. 27C is a sectional view taken along line Y-Y' in FIG. 27A.

FIG. 28A is a plan view illustrating a method for producing a semiconductor device according to an embodiment of the present invention, FIG. 28B is a sectional view taken along line X-X' in FIG. 28A, and FIG. 28C is a sectional view taken along line Y-Y' in FIG. 28A.

FIG. 29A is a plan view illustrating a method for producing a semiconductor device according to an embodiment of the present invention, FIG. 29B is a sectional view taken along line X-X' in FIG. 29A, and FIG. 29C is a sectional view taken along line Y-Y' in FIG. 29A.

FIG. 30A is a plan view illustrating a method for producing a semiconductor device according to an embodiment of the present invention, FIG. 30B is a sectional view taken along line X-X' in FIG. 30A, and FIG. 30C is a sectional view taken along line Y-Y' in FIG. 30A.

FIG. 31A is a plan view illustrating a method for producing a semiconductor device according to an embodiment of the present invention, FIG. 31B is a sectional view taken along line X-X' in FIG. 31A, and FIG. 31C is a sectional view taken along line Y-Y' in FIG. 31A.

FIG. 32A is a plan view illustrating a method for producing a semiconductor device according to an embodiment of the present invention, FIG. 32B is a sectional view taken along line X-X' in FIG. 32A, and FIG. 32C is a sectional view taken along line Y-Y' in FIG. 32A.

FIG. 33A is a plan view illustrating a method for producing a semiconductor device according to an embodiment of the present invention, FIG. 33B is a sectional view taken along line X-X' in FIG. 33A, and FIG. 33C is a sectional view taken along line Y-Y' in FIG. 33A.

FIG. 34A is a plan view illustrating a method for producing a semiconductor device according to an embodiment of the present invention, FIG. 34B is a sectional view taken along line X-X' in FIG. 34A, and FIG. 34C is a sectional view taken along line Y-Y' in FIG. 34A.

FIG. 35A is a plan view illustrating a method for producing a semiconductor device according to an embodiment of the present invention, FIG. 35B is a sectional view taken along line X-X' in FIG. 35A, and FIG. 35C is a sectional view taken along line Y-Y' in FIG. 35A.

FIG. 36A is a plan view illustrating a method for producing a semiconductor device according to an embodiment of the present invention, FIG. 36B is a sectional view taken along line X-X' in FIG. 36A, and FIG. 36C is a sectional view taken along line Y-Y' in FIG. 36A.

FIG. 37A is a plan view illustrating a method for producing a semiconductor device according to an embodiment of the present invention, FIG. 37B is a sectional view taken along line X-X' in FIG. 37A, and FIG. 37C is a sectional view taken along line Y-Y' in FIG. 37A.

FIG. 38A is a plan view illustrating a method for producing a semiconductor device according to an embodiment of the present invention, FIG. 38B is a sectional view taken along line X-X' in FIG. 38A, and FIG. 38C is a sectional view taken along line Y-Y' in FIG. 38A.

FIG. 40A is a plan view illustrating a method for producing a semiconductor device according to an embodiment of the present invention, FIG. 40B is a sectional view taken along line X-X' in FIG. 40A, and FIG. 40C is a sectional view taken along line Y-Y' in FIG. 40A.

FIG. 41A is a plan view illustrating a method for producing a semiconductor device according to an embodiment of the present invention, FIG. 41B is a sectional view taken along line X-X' in FIG. 41A, and FIG. 41C is a sectional view taken along line Y-Y' in FIG. 41A.

DESCRIPTION OF THE PREFERRED EMBODIMENTS

Hereafter, a production process for forming an SGT structure according to an embodiment of the present invention will be described with reference to FIG. 2A to FIG. 41C.

Described first is a first step that includes forming a fin-shaped semiconductor layer on a semiconductor substrate and forming a first insulating film around the fin-shaped semiconductor layer. In this embodiment, a silicon substrate is used, but any semiconductor substrate other than the silicon substrate may be used.

As illustrated in FIGS. 2A to 2C, a first resist 102 for forming a fin-shaped silicon layer is formed on a silicon substrate 101.

As illustrated in FIGS. 3A to 3C, the silicon substrate 101 is etched to form a fin-shaped silicon layer 103. Herein, the fin-shaped silicon layer has been formed using a resist as a mask, but a hard mask such as an oxide film or a nitride film may be used.

As illustrated in FIGS. 4A to 4C, the first resist 102 is removed.

As illustrated in FIGS. 5A to 5C, a first insulating film 104 is deposited around the fin-shaped silicon layer 103. An oxide film formed by high-density plasma or an oxide film formed by low-pressure chemical vapor deposition (CVD) may be used as the first insulating film.

Figure 6C:
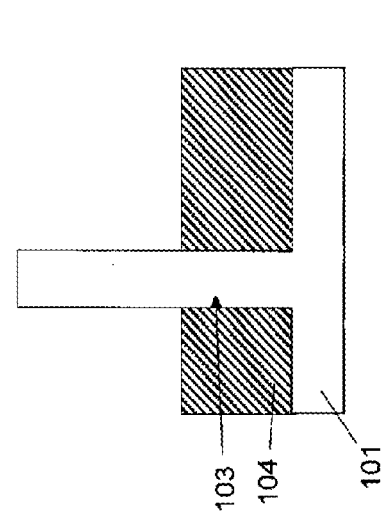
FIG. 6C is a sectional view taken along line Y-Y' in FIG. 6A.
Figure 6A:
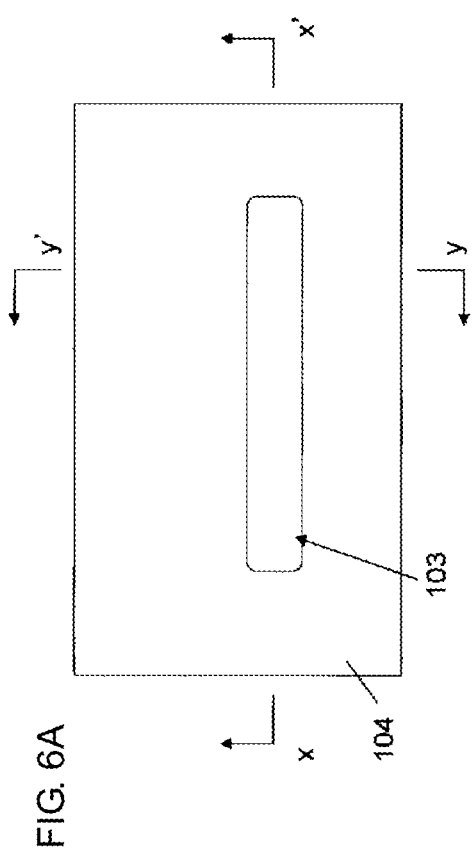
FIG. 6A is a plan view illustrating a method for producing a semiconductor device according to an embodiment of the present invention.
Figure 6B:
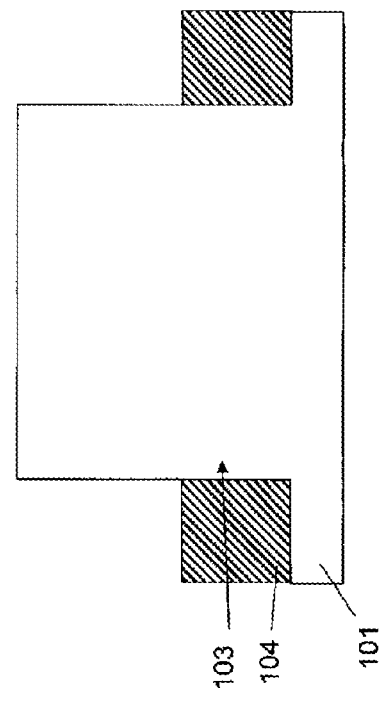
FIG. 6B is a sectional view taken along line X-X' in FIG. 6A.

As illustrated in FIGS. 6A to 6C, the first insulating film 104 is etched back to expose an upper portion of the fin-shaped silicon layer 103. The process so far is the same as that of a method for making a fin-shaped silicon layer in IEDM 2010 CC. Wu, et. al, 27.1.1-27.1.4.

The description so far has shown a first step that includes forming a fin-shaped silicon layer 103 on a silicon substrate 101 and forming a first insulating film 104 around the fin-shaped silicon layer 103.

Described next is a second step that includes forming a second insulating film around the fin-shaped semiconductor layer, depositing a first polysilicon on the second insulating film to perform planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon.

As illustrated in FIGS. 7A to 7C, a second insulating film 105 is formed around the fin-shaped silicon layer 103. The second insulating film 105 is preferably an oxide film.

As illustrated in FIGS. 8A to 8C, a first polysilicon 106 is deposited on the second insulating film 105 to perform planarization.

As illustrated in FIGS. 9A to 9C, a third insulating film 107 is formed on the first polysilicon 106. The third insulating film 107 is preferably a nitride film.

As illustrated in FIGS. 10A to 10C, a second resist 108 for forming a gate line and a pillar-shaped silicon layer is formed so that the second resist 108 extends in a direction perpendicular to a direction in which the fin-shaped silicon layer 103 extends.

As illustrated in FIGS. 11A to 11C, the third insulating film 107, the first polysilicon 106, the second insulating film 105, and the fin-shaped silicon layer 103 are etched to form a pillar-shaped silicon layer 109 and a first dummy gate 106 formed of the first polysilicon. Herein, if the second resist is removed during the etching, the third insulating film 107 functions as a hard mask. If the second resist is not removed during the etching, the third insulating film is not necessarily used.

As illustrated in FIGS. 12A to 12C, the second resist 108 is removed.

The description so far has shown a second step that includes forming a second insulating film around the fin-shaped semiconductor layer, depositing a first polysilicon on the second insulating film to perform planarization, forming a second resist for forming a gate line and a pillar-shaped semiconductor layer so that the second resist extends in a direction perpendicular to a direction in which the fin-shaped semiconductor layer extends, and etching the first polysilicon, the second insulating film, and the fin-shaped semiconductor layer to form a pillar-shaped semiconductor layer and a first dummy gate formed of the first polysilicon.

Described next is a third step that follows the second step and includes forming a fourth insulating film around the pillar-shaped semiconductor layer and the first dummy gate, depositing a second polysilicon around the fourth insulating film, and etching the second polysilicon so that the second polysilicon is left on sidewalls of the first dummy gate and the pillar-shaped semiconductor layer to form a second dummy gate.

Figure 13A:
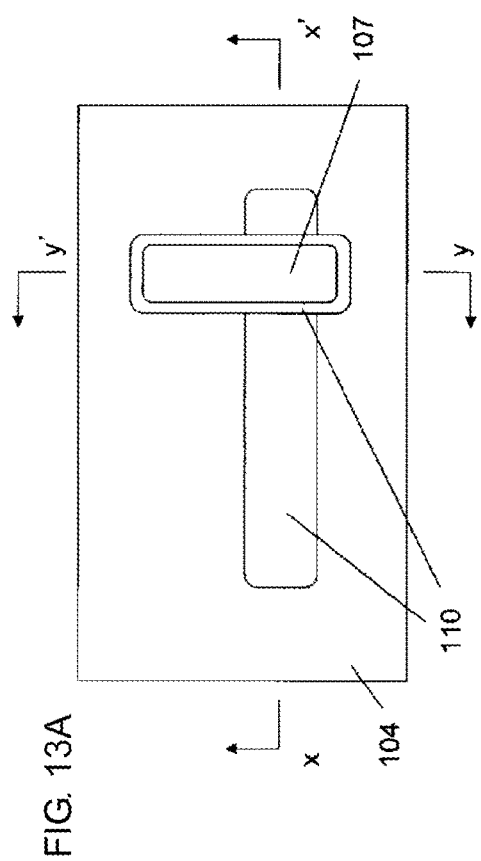
FIG. 13A is a plan view illustrating a method for producing a semiconductor device according to an embodiment of the present invention.
Figure 13C:
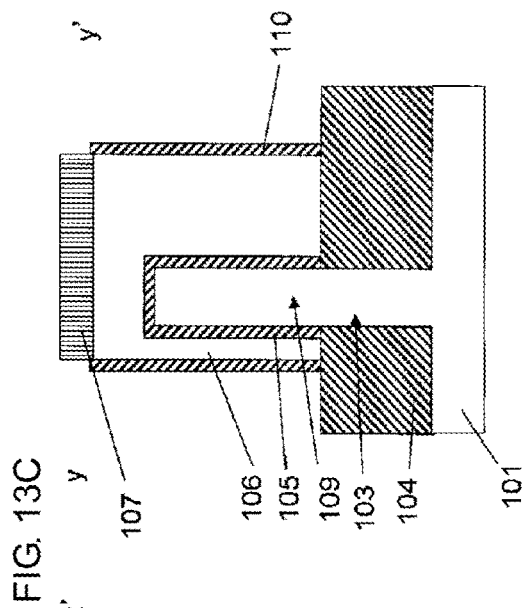
FIG. 13C is a sectional view taken along line Y-Y' in FIG. 13A.
Figure 13B:
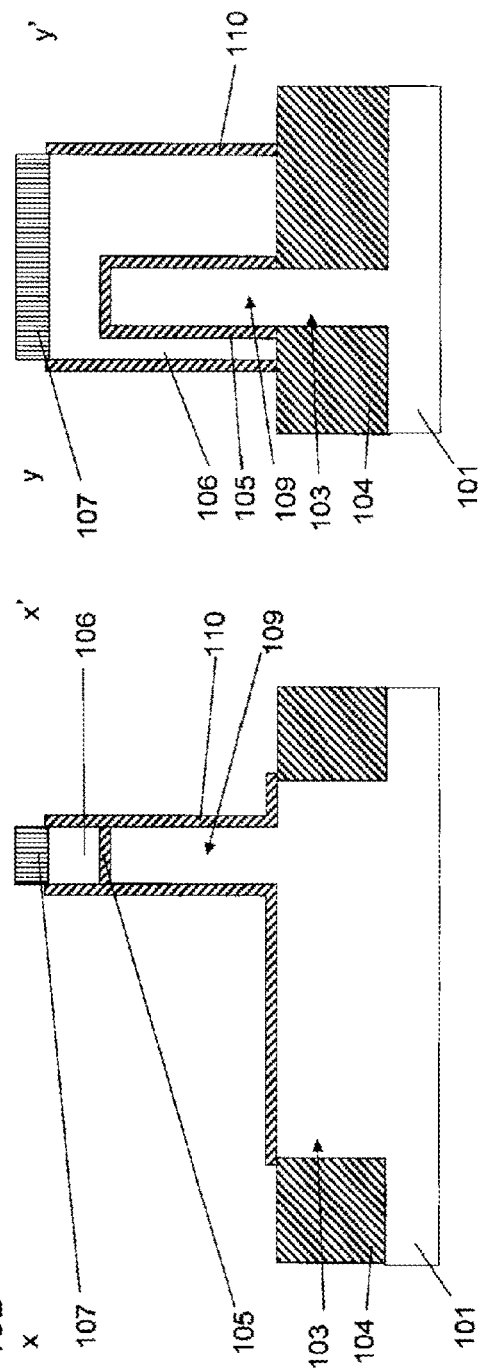
FIG. 13B is a sectional view taken along line X-X' in FIG. 13A.

As illustrated in FIGS. 13A to 13C, a fourth insulating film 110 is formed around the pillar-shaped silicon layer 109 and the first dummy gate 106. The fourth insulating film 110 is preferably an oxide film.

As illustrated in FIGS. 14A to 14C, a second polysilicon 113 is deposited around the fourth insulating film 110.

As illustrated in FIGS. 15A to 15C, the second polysilicon 113 is etched so as to be left on sidewalls of the first dummy gate 106 and the pillar-shaped silicon layer 109 to form a second dummy gate 113.

The description so far has shown a third step that follows the second step and includes forming a fourth insulating film around the pillar-shaped semiconductor layer and the first dummy gate, depositing a second polysilicon around the fourth insulating film, and etching the second polysilicon so that the second polysilicon is left on sidewalls of the first dummy gate and the pillar-shaped semiconductor layer to form a second dummy gate.

Described next is a fourth step that includes forming a fifth insulating film around the second dummy gate, etching the fifth insulating film into a sidewall shape so that a sidewall formed of the fifth insulating film is formed, forming a second diffusion layer in an upper portion of the fin-shaped semiconductor layer and a lower portion of the pillar-shaped semiconductor layer, and forming a metal-semiconductor compound on the second diffusion layer.

As illustrated in FIGS. 16A to 16C, a fifth insulating film 114 is formed around the second dummy gate 113. The fifth insulating film 114 is preferably a nitride film.

As illustrated in FIGS. 17A to 17C, the fifth insulating film 114 is etched so as to be left as a sidewall. As a result, a sidewall 114 formed of the fifth insulating film is formed.

As illustrated in FIGS. 18A to 18C, an impurity is introduced to form a second diffusion layer 115 in an upper portion of the fin-shaped silicon layer 103 and a lower portion of the pillar-shaped silicon layer 109. Arsenic or phosphorus is preferably introduced to form an n-type diffusion layer. Boron is preferably introduced to form a p-type diffusion layer. The introduction of the impurity may be performed before the formation of the fifth insulating film.

As illustrated in FIGS. 19A to 19C, a metal-semiconductor compound 116 is formed on the second diffusion layer 115. A metal-semiconductor compound 117 is also formed in an upper portion of the second dummy gate 113.

The description so far has shown a fourth step that includes forming a fifth insulating film around the second dummy gate, etching the fifth insulating film into a sidewall shape so that a sidewall formed of the fifth insulating film is formed, forming a second diffusion layer in an upper portion of the fin-shaped semiconductor layer and a lower portion of the pillar-shaped semiconductor layer, and forming a metal-semiconductor compound on the second diffusion layer.

Described next is a fifth step that follows the fourth step and includes depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on inner sides of the fifth insulating film, depositing a first metal, and forming a gate electrode and a gate line.

As illustrated in FIGS. 20A to 20C, a contact stopper film 118 is deposited and an interlayer insulating film 119 is deposited. The contact stopper film 118 is preferably a nitride film. There is no need to use the contact stopper film if etching of contact holes can be controlled.

As illustrated in FIGS. 21A to 21C, chemical mechanical polishing is performed to expose an upper portion of the second dummy gate 113 and an upper portion of the first dummy gate 106. During this process, the metal-semiconductor compound 117 formed in the upper portion of the second dummy gate 113 is removed.

As illustrated in FIGS. 22A to 22C, the second dummy gate 113 and the first dummy gate 106 are removed.

As illustrated in FIGS. 23A to 23C, the second insulating film 105 and the fourth insulating film 110 are removed.

As illustrated in FIGS. 24A to 24C, a first gate insulating film 120 is formed around the pillar-shaped silicon layer 109 and on inner sides of the fifth insulating film 114, and a first metal 121 is deposited. A gate electrode 121a is formed around the pillar-shaped silicon layer 109. A gate line 121b is also formed. Since the first gate insulating film 120 is formed around and at bottoms of the gate electrode 121a and the gate line 121b, the gate electrode 121a and the gate line 121b can be insulated from the pillar-shaped silicon layer 109 and the fin-shaped silicon layer 103.

Figure 25A:
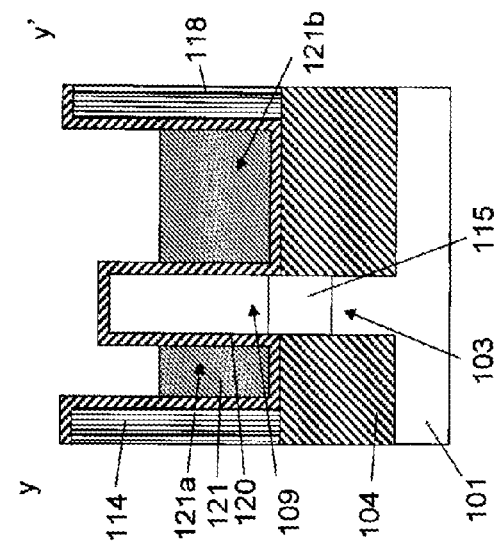
FIG. 25A is a plan view illustrating a method for producing a semiconductor device according to an embodiment of the present invention.
Figure 25B:
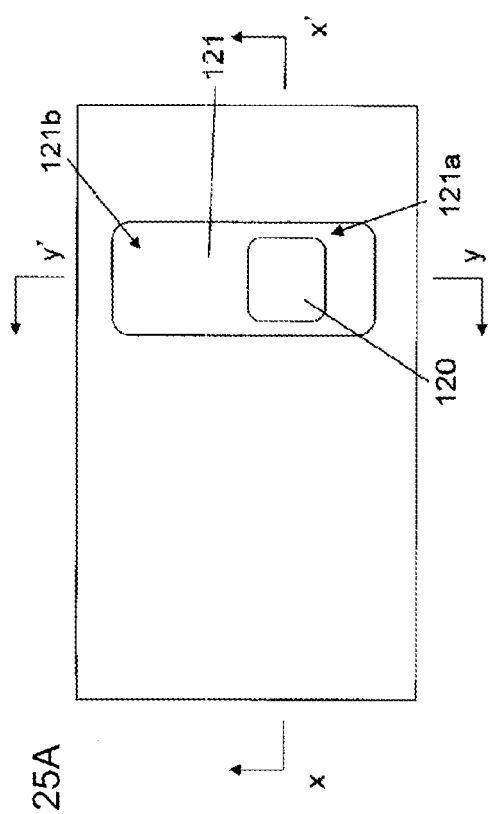
FIG. 25B is a sectional view taken along line X-X' in FIG. 25A.
Figure 25C:
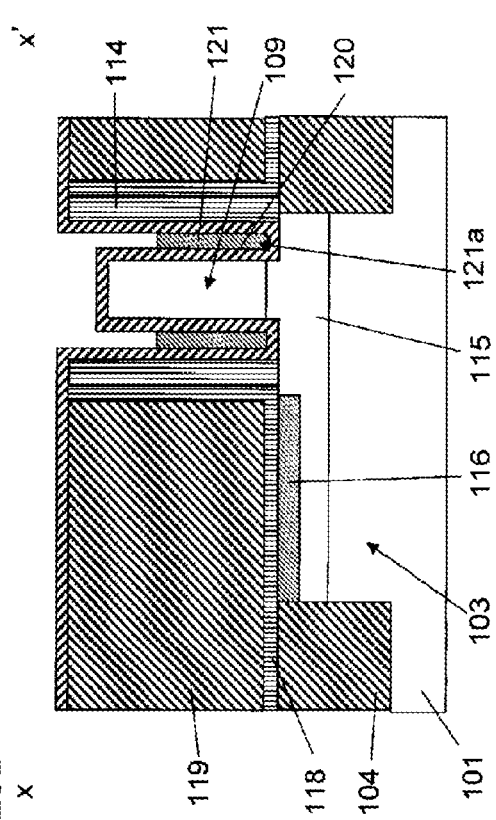
FIG. 25C is a sectional view taken along line Y-Y' in FIG. 25A.

As illustrated in FIGS. 25A to 25C, the first metal 121 is etched back to expose an upper portion of the pillar-shaped silicon layer 109.

The description so far has shown a fifth step that follows the fourth step and includes depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on inner sides of the fifth insulating film, depositing a first metal, and forming a gate electrode and a gate line.

Described next is a sixth step that includes depositing a second gate insulating film around the pillar-shaped semiconductor layer and on the gate electrode and the gate line, removing a portion of the second gate insulating film on the gate line, depositing a second metal, etching back the second metal, removing the second gate insulating film on the pillar-shaped semiconductor layer, depositing a third metal, and etching a portion of the third metal and a portion of the second metal to form a first contact in which the second metal surrounds a sidewall of an upper portion of the pillar-shaped semiconductor layer, a second contact that connects an upper portion of the first contact and an upper portion of the pillar-shaped semiconductor layer, and a third contact made of the second metal and the third metal and formed on the gate line.

As illustrated in FIGS. 26A to 26C, the exposed first gate insulating film 120 is removed.

As illustrated in FIGS. 27A to 27C, a second gate insulating film 123 is deposited around the pillar-shaped silicon layer 109 and on the gate electrode 121a and the gate line 121b.

As illustrated in FIGS. 28A to 28C, a third resist 124 for removing a portion of the second gate insulating film 123 on the gate line 121b is formed.

As illustrated in FIGS. 29A to 29C, a portion of the second gate insulating film 123 on the gate line 121b is removed.

As illustrated in FIGS. 30A to 30C, the third resist 124 is removed.

As illustrated in FIGS. 31A to 31C, a second metal 125 is deposited. When the transistor is an n-type transistor, the work function of the second metal 125 is preferably 4.0 eV to 4.2 eV. When the transistor is a p-type transistor, the work function of the second metal 125 is preferably 5.0 eV to 5.2 eV.

As illustrated in FIGS. 32A to 32C, the second metal 125 is etched back to expose the second gate insulating film 123 on the pillar-shaped silicon layer 109.

As illustrated in FIGS. 33A to 33C, the exposed second gate insulating film 123 on the pillar-shaped silicon layer 109 is removed.

As illustrated in FIGS. 34A to 34C, a third metal 126 is deposited. The third metal may be the same as the second metal.

As illustrated in FIGS. 35A to 35C, a fourth resist 127 for forming a contact hole is formed.

As illustrated in FIGS. 36A to 36C, the interlayer insulating film 119 and the contact stopper film 118 are etched to form a contact hole 128.

As illustrated in FIGS. 37A to 37C, the fourth resist 127 is removed.

As illustrated in FIGS. 38A to 38C, a fourth metal 130 for metal wirings is deposited. Herein, a contact 129 is formed.

Figure 39A:
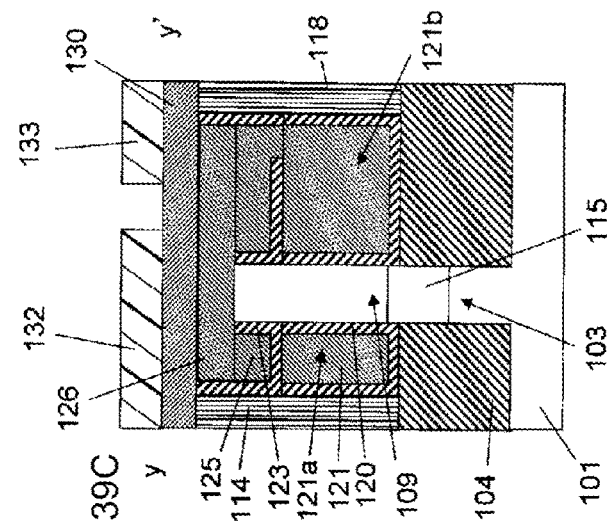
FIG. 39A is a plan view illustrating a method for producing a semiconductor device according to an embodiment of the present invention.
Figure 39B:
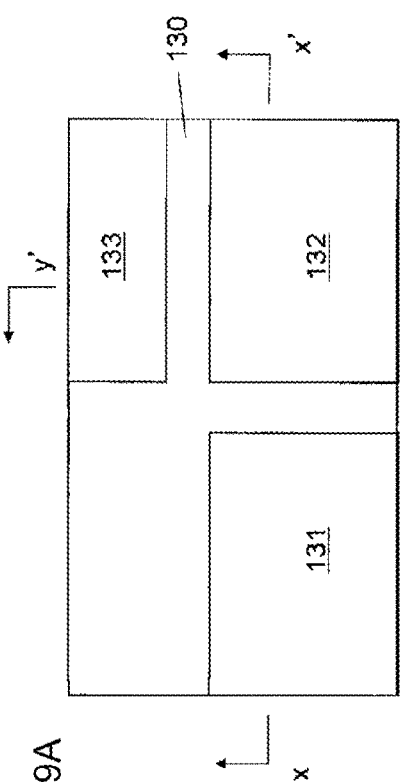
FIG. 39B is a sectional view taken along line X-X' in FIG. 39A.
Figure 39C:
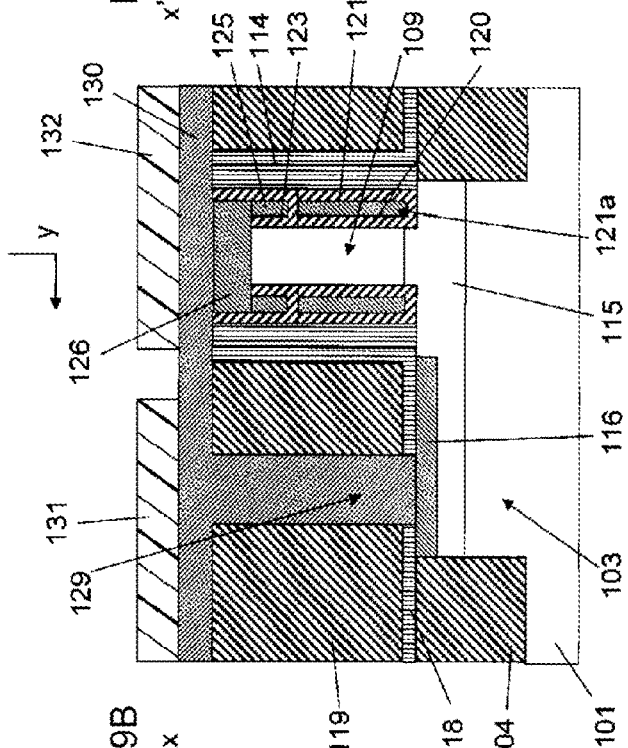
FIG. 39C is a sectional view taken along line Y-Y' in FIG. 39A.

As illustrated in FIGS. 39A to 39C, fifth resists 131, 132, and 133 for forming metal wirings and etching a portion of the third metal 126 and a portion of the second metal 125 are formed.

As illustrated in FIGS. 40A to 40C, the fourth metal 130 is etched to form metal wirings 134, 135, and 136. Furthermore, a portion of the third metal 126 and a portion of the second metal 125 are etched to form a first contact 125a in which the second metal 125 surrounds a sidewall of an upper portion of the pillar-shaped silicon layer 109, a second contact 126a that connects an upper portion of the first contact 125a and an upper portion of the pillar-shaped silicon layer 109, and a third contact 137 made of the second metal 125b and the third metal 126b and formed on the gate line 121b. Before the formation of the metal wirings, the portion of the third metal 126 and the portion of the second metal 125 may be etched. Therefore, misalignment between the first contact, the second contact, and the third contact can be eliminated in a direction perpendicular to a direction in which the gate line extends.

The upper portion of the pillar-shaped silicon layer 109 can be made to function as an n-type silicon layer or a p-type silicon layer by the difference in work function between the second metal and silicon without forming a diffusion layer in the upper portion of the pillar-shaped silicon layer 109. Accordingly, a step of forming a diffusion layer in the upper portion of the pillar-shaped silicon layer can be omitted.

As illustrated in FIGS. 41A to 41C, fifth resists 131, 132, and 133 are removed.

The description so far has shown a sixth step that includes depositing a second gate insulating film around the pillar-shaped semiconductor layer and on the gate electrode and the gate line, removing a portion of the second gate insulating film on the gate line, depositing a second metal, etching back the second metal, removing the second gate insulating film on the pillar-shaped semiconductor layer, depositing a third metal, and etching a portion of the third metal and a portion of the second metal to form a first contact in which the second metal surrounds a sidewall of an upper portion of the pillar-shaped semiconductor layer, a second contact that connects an upper portion of the first contact and an upper portion of the pillar-shaped semiconductor layer, and a third contact made of the second metal and the third metal and formed on the gate line.

Thus, a method for producing an SGT which includes forming a fin-shaped semiconductor layer, a pillar-shaped semiconductor layer, a gate electrode, and a gate line using two masks and which employs a gate last process and a self-aligned process, the SGT having a structure in which an upper portion of the pillar-shaped semiconductor layer is made to function as an n-type semiconductor layer or a p-type semiconductor layer by the difference in work function between metal and semiconductor, has been described.

FIG. 1 illustrates a structure of a semiconductor device obtained by the above-described production method.

The semiconductor device includes a fin-shaped silicon layer 103 formed on a silicon substrate 101, a first insulating film 104 formed around the fin-shaped silicon layer 103, a pillar-shaped silicon layer 109 formed on the fin-shaped silicon layer 103, a first gate insulating film 120 formed around the pillar-shaped silicon layer 109, a gate electrode 121a made of a metal and formed around the first gate insulating film 120, a gate line 121b connected to the gate electrode 121a, made of a metal, and extending in a direction perpendicular to a direction in which the fin-shaped silicon layer 103 extends, a second diffusion layer 115 formed in an upper portion of the fin-shaped silicon layer 103 and a lower portion of the pillar-shaped silicon layer 109, a second gate insulating film 123 formed around a sidewall of an upper portion of the pillar-shaped silicon layer 109, a first contact 125a made of a second metal and formed around the second gate insulating film 123, a second contact 126b made of a third metal and connecting an upper portion of the first contact 125a and an upper portion of the pillar-shaped silicon layer 109, and a third contact 137 made of the second metal and the third metal and formed on the gate line 121b. The first gate insulating film 120 is formed around and at bottoms of the gate electrode 121a and the gate line 121b. An outer width of the gate electrode 121a is equal to a width of the gate line 121b.

After the fifth step, the first contact, the second contact, and the third contact are formed by filling a hole which is present above the gate electrode and the gate line and which has the same shape as those of the gate electrode and the gate line. The width of the first contact in a direction perpendicular to a direction in which the gate line extends is equal to the width of the third contact in the direction perpendicular the direction in which the gate line extends. The width of the first contact in the direction perpendicular to the direction in which the gate line extends is equal to the width of the gate line in the direction perpendicular to the direction in which the gate line extends. The width of the third contact in the direction perpendicular to the direction in which the gate line extends is equal to the width of the gate line in the direction perpendicular to the direction in which the gate line extends. The width of the first contact in the direction perpendicular to the direction in which the gate line extends is equal to the width of the second contact in the direction perpendicular to the direction in which the gate line extends.

Therefore, misalignment between the first contact, the second contact, and the third contact can be eliminated in the direction perpendicular to the direction in which the gate line extends.

In the present invention, the upper portion of the pillar-shaped silicon layer 109 can be made to function as an n-type silicon layer or a p-type silicon layer by the difference in work function between the second metal 125 and silicon without forming a diffusion layer in the upper portion of the pillar-shaped silicon layer 109. Accordingly, a step of forming a diffusion layer in the upper portion of the pillar-shaped silicon layer can be omitted.

When the second metal 125 has a work function of 4.0 eV to 4.2 eV, which is near the work function 4.05 eV of n-type silicon, the upper portion of the pillar-shaped silicon layer 109 functions as n-type silicon. In this case, the second metal is preferably, for example, a compound (TaTi) of tantalum and titanium or tantalum nitride (TaN).

When the second metal 125 has a work function of 5.0 eV to 5.2 eV, which is near the work function 5.15 eV of p-type silicon, the upper portion of the pillar-shaped silicon layer 109 functions as p-type silicon. In this case, the second metal is preferably, for example, ruthenium (Ru) or titanium nitride (TiN).

The first gate insulating film 120 formed around and at bottoms of the gate electrode 121*a* and the gate line 121*b* can insulate the gate electrode 121*a* and the gate line 121*b* from the pillar-shaped silicon layer 109 and the fin-shaped silicon layer 103.

Misalignment between the pillar-shaped silicon layer 109 and the gate line 121*b* can be eliminated because they are formed by self-alignment.

In the present invention, various embodiments and modifications can be made without departing from the broad sprit and scope of the present invention. Furthermore, the above-described embodiment is provided to describe one embodiment of the present invention, and the scope of the present invention is not limited thereto.

For example, the technical scope of the present invention naturally includes a method for producing a semiconductor device in which the conductivity types, p (including p$^+$) and n (including n$^+$), are reversed from the embodiment described above, and a semiconductor device obtained through the method.

The invention claimed is:

1. A method for producing a semiconductor device, the method comprising:
   a first step of forming a fin-shaped semiconductor layer on a semiconductor substrate and forming a first insulating film around the fin-shaped semiconductor layer;
   a second step following the first step, the second step including forming a pillar-shaped semiconductor layer and a first dummy gate comprising a first polysilicon;
   a third step following the second step, the third step including forming a second dummy gate on sidewalls of the first dummy gate and the pillar-shaped semiconductor layer;
   a fourth step following the third step, the fourth step including forming a fifth insulating film left as a sidewall around the second dummy gate, forming a second diffusion layer in an upper portion of the fin-shaped semiconductor layer and a lower portion of the pillar-shaped semiconductor layer, and forming a metal-semiconductor compound on the second diffusion layer;
   a fifth step following the fourth step, the fifth step including depositing an interlayer insulating film, exposing an upper portion of the second dummy gate and an upper portion of the first dummy gate, removing the second dummy gate and the first dummy gate, forming a first gate insulating film around the pillar-shaped semiconductor layer and on inner sides of the fifth insulating film, depositing a first metal, and forming a gate electrode and a gate line; and
   a sixth step following the fifth step, the sixth step including depositing a second gate insulating film around the pillar-shaped semiconductor layer and on the gate electrode and the gate line, removing a portion of the second gate insulating film on the gate line, depositing a second metal, etching back the second metal, removing the second gate insulating film on the pillar-shaped semiconductor layer, depositing a third metal, and etching a portion of the third metal and a portion of the second metal to form a first contact in which the second metal surrounds a sidewall of an upper portion of the pillar-shaped semiconductor layer, a second contact that connects an upper portion of the first contact and an upper portion of the pillar-shaped semiconductor layer, and a third contact made of the second metal and the third metal and formed on the gate line.

2. The method according to claim 1, wherein the second step further comprises:
   forming a second insulating film around the fin-shaped semiconductor layer,
   depositing the first polysilicon on the second insulating film to perform planarization,
   forming a second resist for forming the gate line and the pillar-shaped semiconductor layer so that the second resist extends in a direction perpendicular to a direction in which the fin-shaped semiconductor layer extends, and
   etching the first polysilicon, the second insulating film, and the fin-shaped semiconductor layer to form the pillar-shaped semiconductor layer and the first dummy gate formed of the first polysilicon.

3. The method according to claim 2, wherein the second step further comprises forming a third insulating film on the first polysilicon after depositing the first polysilicon on the second insulating film to perform planarization.

4. The method according to claim 1, wherein the third step further comprises:
   forming a fourth insulating film around the pillar-shaped semiconductor layer and the first dummy gate,
   depositing a second polysilicon around the fourth insulating film, and
   etching the second polysilicon so that the second polysilicon is left on sidewalls of the first dummy gate and the pillar-shaped semiconductor layer to form the second dummy gate.

5. The method according to claim 4, wherein the fifth step further comprises:
   depositing an interlayer insulating film,
   performing chemical mechanical polishing to expose an upper portion of the second dummy gate and an upper portion of the first dummy gate,
   removing the second dummy gate and the first dummy gate,
   removing the fourth insulating film,
   forming a first gate insulating film around the pillar-shaped semiconductor layer and on inner sides of the fifth insulating film,
   depositing a first metal, and
   etching back the first metal to form the gate electrode and the gate line.

6. The method according to claim 5, further comprising, after the fourth step, depositing a contact stopper film.

7. The method according to claim 1, wherein the fourth step further comprises:

forming the fifth insulating film around the second dummy gate, etching the fifth insulating film into a sidewall shape so that a sidewall formed of the fifth insulating film is formed, forming the second diffusion layer in the upper portion of the fin-shaped semiconductor layer and the lower portion of the pillar-shaped semiconductor layer, and forming the metal-semiconductor compound on the second diffusion layer.

8. The method according to claim 1, further comprising, after the fifth step, removing the first gate insulating film.

9. The method according to claim 1, wherein a metal that forms the first contact has a work function of 4.0 eV to 4.2 eV.

10. The method according to claim 1, wherein a metal that forms the first contact has a work function of 5.0 eV to 5.2 eV.

* * * * *